(12) United States Patent
Boerner et al.

(10) Patent No.: US 8,536,783 B2
(45) Date of Patent: Sep. 17, 2013

(54) ELECTROLUMINESCENT DEVICE WITH PROTECTIVE MEANS FOR CONTACT AREAS

(75) Inventors: Herbert F. Boerner, Aachen (DE); Claudia M. Goldmann, Kreuzau (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/146,928

(22) PCT Filed: Jan. 28, 2010

(86) PCT No.: PCT/IB2010/050378
§ 371 (c)(1),
(2), (4) Date: Jul. 29, 2011

(87) PCT Pub. No.: WO2010/089683
PCT Pub. Date: Aug. 12, 2010

(65) Prior Publication Data
US 2011/0279026 A1    Nov. 17, 2011

(30) Foreign Application Priority Data
Feb. 5, 2009   (EP) .................................... 09152170

(51) Int. Cl.
*H01L 51/52* (2006.01)
*H01L 27/32* (2006.01)
*H05B 33/00* (2006.01)

(52) U.S. Cl.
USPC ........... 313/506; 313/504; 313/514; 313/498; 445/58

(58) Field of Classification Search
USPC ................................. 313/504–506
See application file for complete search history.

(56) References Cited

U.S. PATENT DOCUMENTS

| 7,557,502 B2 * | 7/2009 | Schlenker | 313/512 |
| 8,179,036 B2 * | 5/2012 | Eser et al. | 313/504 |
| 2007/0114523 A1 * | 5/2007 | Oumi et al. | 257/40 |
| 2007/0138946 A1 * | 6/2007 | Cok | 313/504 |
| 2008/0157661 A1 * | 7/2008 | Kajikawa et al. | 313/504 |
| 2008/0169750 A1 | 7/2008 | Kim et al. | |
| 2008/0231180 A1 * | 9/2008 | Waffenschmidt et al. | 313/506 |
| 2010/0084963 A1 * | 4/2010 | Lifka et al. | 313/498 |
| 2010/0127617 A1 * | 5/2010 | Hayafuji et al. | 313/504 |

FOREIGN PATENT DOCUMENTS

| EP | 1939952 A2 | 7/2008 |
| JP | 07192873 | 7/1995 |
| JP | 09148069 | 6/1997 |
| JP | 2007335105 | 12/2007 |
| WO | 2007013001 A2 | 2/2007 |
| WO | WO 2008126267 A1 * | 10/2008 |
| WO | 2008132655 A2 | 11/2008 |

\* cited by examiner

*Primary Examiner* — Sikha Roy
(74) *Attorney, Agent, or Firm* — David Zivan; Mark Beloborodov

(57) ABSTRACT

The invention relates to an electroluminescent device (10) comprising a substrate and on top of the substrate a substrate electrode, a counter electrode and an electroluminescent layer stack with at least one organic electroluminescent layer (50) arranged between the substrate electrode (20) and the counter electrode (30), and an encapsulation means (90) encapsulating at least the electroluminescent layer stack, the electroluminescent device (10) comprises at least one contact means (60), for electrically contacting the counter electrode (30) to an electrical source.
The invention discloses that at least one protective means (70) is arranged on the substrate electrode (20), wherein the protective means (70) is electrically non-conductive and is at least fully covering the area below the contact means (60).

11 Claims, 18 Drawing Sheets

ELECTROLUMINESCENT DEVICE WITH PROTECTIVE MEANS FOR CONTACT AREAS

FIELD OF THE INVENTION

This invention relates to an electroluminescent device according to the preamble of the claim 1, comprising a substrate and on top of the substrate a substrate electrode, a counter electrode and an electroluminescent layer stack with at least one organic electroluminescent layer arranged between the substrate electrode and the counter electrode, and an encapsulation means encapsulating at least the electroluminescent layer stack, the electroluminescent device comprises at least one contact means, for electrically contacting the counter electrode to an electrical source. Furthermore, the invention relates to a method for protecting a substrate electrode of an electroluminescent device according to claim 10.

BACKGROUND OF THE INVENTION

In the WO 2007/013 001 A2 an organic light emitting diode (OLED) is described. The organic light emitting diode consists of a thin layer of approximately 100 nm of organic substances, sandwiched between two electrodes. The electrode layers normally possess a thickness approximately equal to the thickness of the organic substance. When a voltage—typically between 2 and 10 volts—is applied between the two electrodes, the organic substances emit light. Unfortunately, due to its small thickness the resistance of such electrodes is high, so that it is difficult to achieve a homogeneous distribution of the voltage over an area of the electrode. To eliminate this disadvantage, conducting posts are applied to the counter electrode of the OLED in the international patent application mentioned above. These conducting posts are connected to an encapsulation means, encapsulating the stack of layers formed by the electrodes and the electroluminescent layer. Unfortunately, the organic layers and the counter electrode are very sensitive. Therefore, connecting the conducting posts with the counter electrodes often leads to shorts. These shorts may for example emerge due to local destruction of the soft organic layers, bringing the counter electrode and the substrate electrode into direct contact.

SUMMARY OF THE INVENTION

Thus, the invention has for its object to eliminate the above mentioned disadvantages. In particular, it is an object of the invention to provide an electroluminescent device, which can easily be connected without the danger of a short.

This object is achieved by an electroluminescent device as taught by claim 1 of the present invention. Also the object is achieved by a method as taught by claim 10 of the present invention. Advantageous embodiments of the electroluminescent device and the method are defined in the sub claims. Features and details described with respect to the electroluminescent device also apply to the method and vice versa.

This invention discloses that at least one protective means is arranged on the substrate electrode, wherein the protective means is electrically non-conductive and is at least fully covering the area below the contact means.

The leading idea of the present invention is to use a protective means to prevent a short, induced by the connection of the contact means to the counter electrode and/or by the contact means itself. Due to the thickness of the counter electrode a damage by the contact means can easily lead to a short. As also the thickness of the organic electroluminescent layer is small, parts of the damaged counter electrode may penetrate this organic electroluminescent layer and get into direct contact with the substrate electrode. To prevent this, the protective means is arranged on the substrate electrode and is electrically nonconductive. Therefore, the elements of the counter electrode being bent towards the substrate electrode are prevented from a direct contact with the substrate electrode by the protective means as it is at least fully covering the area below the contact means or may further exceed the area below the contact means. Due to the protective means the disclosed electroluminescent device can easily be connected to an electrical source, as no special considerations concerning the contact means have to be made. Even if the contacting is done in a way that the contact means damages the counter electrode, there is no risk of a short as the protective means will prevent any direct contact between the contact means or the counter electrode and the substrate electrode. To achieve this aim, the area covered by the protective means is at least fully below or may exceed the area, where the contact means is in contact with the counter electrode. So the protective means is at least fully covering the area below the contact means.

In the context of the invention the notion electroluminescent (EL) layer stack denotes all layers prepared between the substrate electrode and the counter electrodes. In one embodiment of an EL layer stack, it comprises at least one light emitting organic electroluminescent layer prepared between substrate and counter electrode. In other embodiments the layer stacks may comprise several layers prepared between substrate and counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. In a preferred embodiment the substrate electrode and or the counter electrode comprise at least one of the following materials: ITO, aluminum, silver, doped ZnO or an oxide layer.

In the context of the invention the notion substrate denotes a base material onto which the different layers of an electroluminescent device are deposited. Normally, the substrate is transparent and is made of glass. Furthermore, it may be preferable that the substrate is transparent, preferably comprising at least one of the following materials: silver, gold, glasses or ceramics. It may also be a transparent polymer sheets or foils with a suitable moisture and oxygen barrier to essentially prevent moisture and/or oxygen entering the electroluminescent device layer stack. It is also possible to use non-transparent materials like metal foils as substrate. The substrate may comprise further layers, e.g. for optical purposes like light out-coupling enhancement or other purposes. The substrate is usually flat, but it may also be shaped into any three-dimensional shape that is desired.

In the context of the invention the notion substrate electrode denotes an electrode deposited on top of the substrate. Usually it consists of transparent ITO (Indium-Tin oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers (8-15 nm thick) are used single or in combination with ITO as the substrate electrode. If a metal foil is used as the substrate, it takes also the role of the substrate electrode, either anode or cathode. The notation on-top-of denoted the sequence of the listed layers. This notation explicitly comprises the possibility of further layers in between the layer denoted as on top of each other. For example, there might be additional optical layers to enhance the light out-coupling arranged between substrate electrode and substrate.

In the context of the invention the notion counter electrode denotes an electrode away from the substrate. It is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers.

In the context of the invention an electroluminescent device with a combination of a transparent substrate, a transparent substrate electrode and a non-transparent counter electrode (usually reflective), emitting the light through the substrate is called "bottom-emitting". In case of electroluminescent device comprising further electrodes, in certain embodiments both substrate and counter electrodes could be either both anodes or both cathodes, when the inner electrodes as driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and the encapsulation means are transparent. Here the electroluminescent device is both, bottom and top-emitting. In the context of the invention a layer, substrate or electrode is called transparent if the transmission of light in the visible range is more than 50%; the rest being absorbed or reflected. Furthermore, in the context of the invention a layer, substrate or electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

Furthermore, in the context of the invention a layer, connector or construction element of an electroluminescent device is called electrically conducting if its electrical resistance is less than 100000 Ohm. In the context of the invention passive electronic components comprise resistors, capacitors and inductivities. Furthermore, in the context of the invention active electronic components comprise diodes, transistors and all types of integrated circuits.

In the context of the invention a layer, substrate, electrode or a construction element of an electroluminescent device is called reflective if light incident on its interface is returned according to the law of reflection: the macroscopic angle of incidence equals the macroscopic angle of reflection. Also the term specular reflection is used in this case. Furthermore, in the context of the invention a layer, substrate, electrode or a construction element of an electroluminescent device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

In a preferred embodiment the protective means comprises non-conductive glue. Non-conductive glue has the advantage, that it is easy to apply and will not damage the substrate electrode. Furthermore, it can be applied in air and there is no need to use a vacuum chamber or a clean room. Therefore, a drop of non-conductive glue can easily be applied to the substrate electrode and prevent as a protective means any short between the two electrodes.

To achieve lasting non-conductive glue at least one of the following matrices may be used: epoxies, polyurethanes, acrylic or silicone.

Oxygen or water may damage the organic electroluminescent layer or the counter electrode. As the protective means may have direct contact with the organic electroluminescent layer, it is preferred, that the non-conductive glue of the protective means is anhydrous and/or water free. In the context of the invention, the notion water free and/or anhydrous describes the fact, that no degradation due to water content during the average lifetime of an electroluminescent device can be observed by the naked eye. A visible degradation of the organic electroluminescent layer due to water diffusing into the layer stack can take the form of growing black spots or shrinkage of the emissive region from the edges. The notion water free and/or anhydrous not only depends on the non-conductive glue itself but also on the amount of water, which can be absorbed by the organic electroluminescent layer without damaging it.

In a further preferred embodiment the electroluminescent device may comprise moisture and/or oxygen barriers. In the context of the invention layers prevention harmful diffusion of moisture and/or oxygen into the layer stack are called moisture and/or oxygen barriers. A diffusion is denoted as harmful if a significant life-time reduction of the emitted light can be observed. Standard OLED devices according to state of the art achieve shelf life times in the order of 100000 hours or more. A significant reduction denotes a reduced life-time of about a factor of 2 or more.

In another preferred embodiment the protective means may comprise at least one of the following: a photo resist, a lacquer, paint or a layer of glass, made of re-melted glass frit or an oxidized metal layer, preferably anodized Aluminum. The protective means has to prevent the direct contact between the counter electrode and the substrate electrode, which would lead to a short. The named materials can easily be applied to the substrate electrode, often without the need of a clean room or a vacuum chamber. Therefore, the application of the protective means can be done easily and economically. People skilled in the art may choose other electrically non-conductive materials within the scope of this invention.

The protective means must have properties that on the one hand ensure that it is electrically not conductive. Furthermore, it must be thick and/or hard enough to shield the substrate electrode from the contact means. The precise thickness and hardness depend on the actual pressure exerted by the contact means, but typically 1-100 micrometer thickness are sufficient. The desired protection has been achieved with photoresist layers of 1.5 micrometer thickness as well as with layers of non-conductive glue of 10-200 micrometer thickness, but thicker layers can also be used. Furthermore, it must be ensured that the protective means does not damage either the substrate electrode, the organic electroluminescent layer or the counter electrode. In preferred embodiment the protective means comprises non-conductive glue. Furthermore, it is preferable that the non-conductive glue of the protective means is anhydrous and/or water free.

The electroluminescent device according to the invention comprises an encapsulation means to encapsulate the electroluminescent layer stack. The encapsulation means may also encapsulate the whole stack of layers of the electroluminescent device or just a plurality of layers, forming a part of the whole stack of layers. Preferably, the encapsulation means is a gas-tight element, covering at least the organic electroluminescent layer and the counter electrode. By using a gas-tight encapsulation means, it is prevented that environmental factors like water, or oxygen can damage the encapsulated layers. The encapsulation means may form a gas-tight lid. This lid may be formed of glass or metal. It is also possible to form the encapsulation means by one or a plurality of layers applied to the electroluminescent device or just parts of it. The layers may comprise silicon, silicon oxide, silicon nitride, aluminum oxide or silicon oxinitride. All the named encapsulation means prevent mechanical and/or environmental factors from affecting the layer stack of the electroluminescent device adversely.

As an example, the encapsulation means can be made of metals, glass, ceramics or combinations of these. It is attached to the substrate by conductive or non-conductive glue, melted glass frit or metal solder. Therefore, it may also provide mechanical stability for the electroluminescent device.

In a preferred embodiment, the encapsulation means is electrically connected to the contact means. The electrical connection between the contact means and the encapsulation means may be direct or indirect. In a direct manner, the encapsulation means has direct contact with the contact means. In the indirect manner, a means like a wire may be used to connect the encapsulation means and the contact means. Apart from the named wire other means may be used to connect the encapsulation means and the contact means, which are known to a person skilled in the art. It is possible to connect the electroluminescent device to an electrical source with the help of the encapsulation means. Therefore, a wire etc. may be attached to the encapsulation means, which transfers the electrical current via the contact means to the counter electrode. A requirement for this embodiment is that the encapsulation means is at least conductive in one part. To prevent shorts, the encapsulation means has then to be insulated against the substrate electrode. This may be realized in such a way that the encapsulation means is divided in two areas. One of them is an electrically conductive contact area and one is an electrically insulating area. The encapsulation means has to be designed in such a way, that the electrically conductive contact area is connected to the contact means.

In another preferred embodiment the encapsulation means comprises an electrically conductive gas-tight feed through. This gas-tight feed through comprises a conductive element, which is connected to the connection means. This may be done by direct contact or by help of a wire or an element known to a person skilled in the art. If the encapsulation means is electrically conductive and connected to the substrate electrode it is preferred that the gas-tight feed through is electrically insulated against the encapsulation means. This may be done by an insulation means in which the conductive element is embedded. This insulation means for the gas-tight feed through may for example be formed by glass or ceramic, encasing the conductive element.

In another preferred embodiment the encapsulation means comprises an electrically conductive contact area. In this embodiment the encapsulation means consists of two different elements, one forming the contact area and another one forming an insulating area. Preferably, the contact area is arranged on top of the encapsulation means. Alternative, the contact area may be formed by an element embedded in the encapsulation means, wherein this embedded element is conductive. For example a metal disk may be embedded in a gas-tight multilayer structure, forming the encapsulation means. This metal disk then forms the contact area, which is in electrical contact with the contact means of the electroluminescent device. Preferably, the contact area is electrically insulated against the encapsulation means. This may be done by embedding the contact area in glass or ceramic or another material known to a person skilled in the art.

The leading idea of the present invention is to prevent any short between the two electrodes of the disclosed electroluminescent device triggered by the contact means and/or the application of the contact means to the counter electrode by using the protective means. Therefore, various contact means can be applied to the disclosed electroluminescent device without the danger of a short. To further diminish the probability of a short a plurality of contact means are disclosed within this invention, which may be used to connect the electroluminescent device, especially the counter electrode to an electrical source. Even if one of the named contact means is deliberately used to damage the counter electrode in an area, where the contact means is in contact to the counter electrode no short will occur as the protective means is arranged at least fully below the damaged area of the counter electrode will prevent this.

The contact means may comprise a spring, which is placed between the encapsulation means and the counter electrode. This spring may therefore be in direct contact with the counter electrode and conduct electrical current from the encapsulation means to the counter electrode. The spring may be attached to the counter electrode, e.g. by soldering, laser welding or ultrasonic welding. The attachment process may lead to a penetration of the counter electrode and/or the electroluminescent layer stack. Again the protective means below would prevent a short. In another embodiment the spring may press a coin-like contact plate to the counter electrode. Even if the surface of this coin-like element may not be perfectly flat, but penetrates parts of the counter electrode, no short will occur as the protective means below will prevent that the surface of the contact means gets into electrical contact with the substrate electrode.

In another preferred embodiment the contact means may comprise an arc-shaped spring. The arc-like shaped spring can easily be attached to the encapsulation means and the contact between the contact means and the counter electrode is easily established. In another preferred embodiment, the contact means is a rounded tip. It may also comprise a spring, which presses the rounded tip onto the counter electrode. Due to the large area of contact between the rounded tip and the counter electrode a reliable contact is established.

As disclosed a protective means may comprise non-conductive glue. This non-conductive glue may be transparent, opaque or comprise scattering properties. Depending on the material used for the protection means, experiments have shown that the area to which the protection means is applied may appear dark at normal operation of the electroluminescent device, since charge injection from the substrate electrode to the electroluminescent layer stack is blocked. Therefore, another preferred embodiment is characterized in that the protective means comprises at least one scattering means, for scattering light generated by the organic electroluminescent layer; preferably that the scattering means is embedded in the protective means. This scattering means scatters and or reflects part of the artificial light guided by the substrate. This results in a brightening of the otherwise non-emissive area. As the substrate often works as a kind of light guide, the scattering means of the protective means enables this light to be scattered and reflected out of the electroluminescent device. The scattering means may be formed by a plurality of pigments and/or flakes embedded in the protective means. This pigments and/or flakes may for example comprise: aluminum, mica effect pigments, titan dioxide particles or other flakes or particles known to a person skilled in the art as scattering and/or reflecting the artificial light of the organic electroluminescent device.

In another preferred embodiment the protective means is dyed. This may be done by coloring the protective means itself or by applying colored pigments to the protective means.

In another embodiment the protective means is arranged as a closed contour having an inner edge and an outer edge framing the electroluminescent layer stack, wherein the counter electrode partly covers the closed contour establishing a contiguous gap between the outer edge of the contour and the edge of the counter electrode sufficiently large to isolate the counter electrode from the substrate electrode. With such a closed contour, the manufacturing effort can be further reduced by applying the same mask for depositing the electroluminescent layer stack and the counter electrode. Applying the same mask for the deposition of electroluminescent layer stack and counter electrode without a non-conducting closed contour on top of the substrate electrode framing said layer stack, it would be very likely, that both electrodes are in electrical contact somewhere at the edge of the counter electrode. In this embodiment, the isolation between substrate and counter electrode is maintained by the contiguous gap between counter electrode and the outer edge of the contour of the non-conducting protection means.

To achieve a homogeneous distribution of the voltage across the area of the counter electrode it is preferred, that a plurality of contact means are applied to the counter electrode. By using a number of contact means, the achieved distribution of the voltage is more homogeneous. It might be appropriate to connect all contact means to the same potential of the electrical source. This transforms into a uniform distribution of current and voltage to the organic electroluminescent layer and in a homogeneous generation of artificial light by the organic electroluminescent layer. To prevent a short, the numbers of protective means applied to the substrate electrode depends on the number of contact means. Therefore, it is preferable that a plurality of protective means are arranged on the substrate electrode. For known electroluminescent devices it has shown to be preferable that the following numbers of protective means are applied to the substrate electrode: 2, 4, 5, 8, 16 or 32.

In another preferred embodiment the counter electrode is structured in a plurality of electrically separated counter electrode segments, wherein each counter electrode segment comprises at least one protective means. In this embodiment the counter electrode is not as a whole connected to the electrical source. Rather than that, the counter electrode is structured. This structuring of the counter electrode leads to separated counter electrode segments. Therefore, no electrical current can flow directly between the separated counter electrodes. The counter electrodes may be connected by the use of the encapsulation means. As each of the counter electrode segments comprises at least one contact means, which is connected to the encapsulation means, there may be an contact between the counter electrode segments via the encapsulation means. But there is no direct contact between the counter electrode segments. For each contact means one protective means may be applied to the substrate electrode to prevent any kind of short. Furthermore, on protective means may be arranged beneath a plurality of contact means.

The object of the present invention is also achieved by a method for protecting a substrate electrode of an electroluminescent device, wherein the electroluminescent device comprises an electroluminescent layer stack with at least one organic electroluminescent layer arranged between a substrate electrode and a counter electrode on top of a substrate and an encapsulation means encapsulating at least the electroluminescent layer stack, the electroluminescent device comprises at least one contact means, for electrically contacting the counter electrode to an electrical source, the method comprising the step:

applying at least one protective means on the substrate electrode, wherein the protective means is electrically non-conductive and is at least fully covering the area below the contact means.

Features and details described with respect to the electroluminescent device also apply to the method and vice versa.

The disclosed electroluminescent device described above is preferably manufactured in accordance with the disclosed method.

The protective means is a layer which protects the organic layers and the counter electrode against any negative effect from the contact means by insulating the substrate electrode reliably towards the counter electrode. Thus, even if the contact means may damage the counter electrode and the organic layers no short will occur, as the protective means prevents any direct contact between the two electrodes. The protective means may comprise non-conductive glue or photoresist. The area of the protective means may extend beyond the area of the contact means.

The invention also discloses the use of a protective means for preventing shorts between the substrate electrode and a counter electrode, provided with at least one contact means. The protective means is arranged on the substrate electrode and therefore prevents a direct contact between the substrate electrode and the counter electrode, even if the contact means penetrates part of the counter electrode and the organic layers.

Furthermore, the invention discloses the use of non-conductive glue as a protective means for preventing a short between a substrate electrode and a counter electrode, provided with at least one contact means. The use of non-conductive glue as a protective means has the advantage, that non-conductive glue can easily be applied to the substrate electrode. Non-conductive glue is mostly a viscous fluid, which can easily be attached to the substrate electrode. There is no need of a clean room or a vacuum chamber. Furthermore, non-conductive glue has the advantage that it does not damage the organic electroluminescent layer and the counter electrode by which the protective means is covered.

The invention also relates to a substrate covered by only one contiguous electrode to be used as a substrate electrode in an electroluminescent device according to our present invention. The contiguous electrode is not structured denoting any electrode, where the substrate area coated with the electrode to be the substrate electrode is not adapted to apply a second conductive area onto the substrate within the encapsulated area of the substrate area of an organic electroluminescent device covered by an encapsulation means, which is electrically isolated to the substrate electrode.

To produce the disclosed electroluminescent device of the invention, the different layers of the layer stack are deposited onto the substrate. After depositing the substrate electrode onto the substrate, the protective means may be applied to the substrate electrode. Afterwards, the organic layers are deposited. Finally, the counter electrode is deposited. According to the state of the art, the preferred deposition technology for the organic layers and the counter electrode is vacuum evaporation. Vacuum evaporation is a deposition technology, where the materials to be deposited follow a straight path from the evaporation source to the substrate, leading to a directed deposition. If the protective means has steep edges or overhanging edges, shadowing effects will occur, which lead to holes in the organic layers and the counter electrode. To prevent this undesirable effect, it is preferable that the protective means has smooth and non-steep edges. Therefore, the invention also claims a protective means comprising material properties and/or application procedures that prevents the emergence of a shadowing edge on a substrate electrode. In a preferred embodiment the material property preventing the emergence of a shadowing edge is the viscosity, e.g. the viscosity at enhanced temperature. Preferably the viscosity is low. If non-conductive glue is used as protective means it may be applied like a drop onto the substrate electrode. If this non-conductive glue of the protective means comprises a viscosity that enables it to flow, a smooth hill-like shape of the protective means will result, which prevents shadowing effects. If a material is used for the protective means that gives rise to steep edges that may create shadowing effects if only one deposition source is used, several deposition sources could be used to deposit material from different directions onto the substrate. It may also be advisable to rotate or otherwise move the substrate during deposition to ensure a continuous layers deposition over the protective means.

The aforementioned electroluminescent device and/or method, as well as claimed components and the components to be used in accordance with the invention in the described embodiments are not subject to any special exceptions with respect to size, shape, material selection. Technical concepts such that the selection criteria are known in the pertinent field can be applied without limitations. Additional details, characteristics and advantages of the object of the present invention are disclosed in the subclaims and the following description of the respective figures—which are an exemplary fashion only—showing a plurality of preferred embodiments of the electroluminescent device according to the present invention.

BRIEF DESCRIPTION OF THE DRAWINGS

Further embodiments of the invention will be described with respect to the following figures, which show.

DETAILED DESCRIPTION OF EMBODIMENTS

Figure 1:
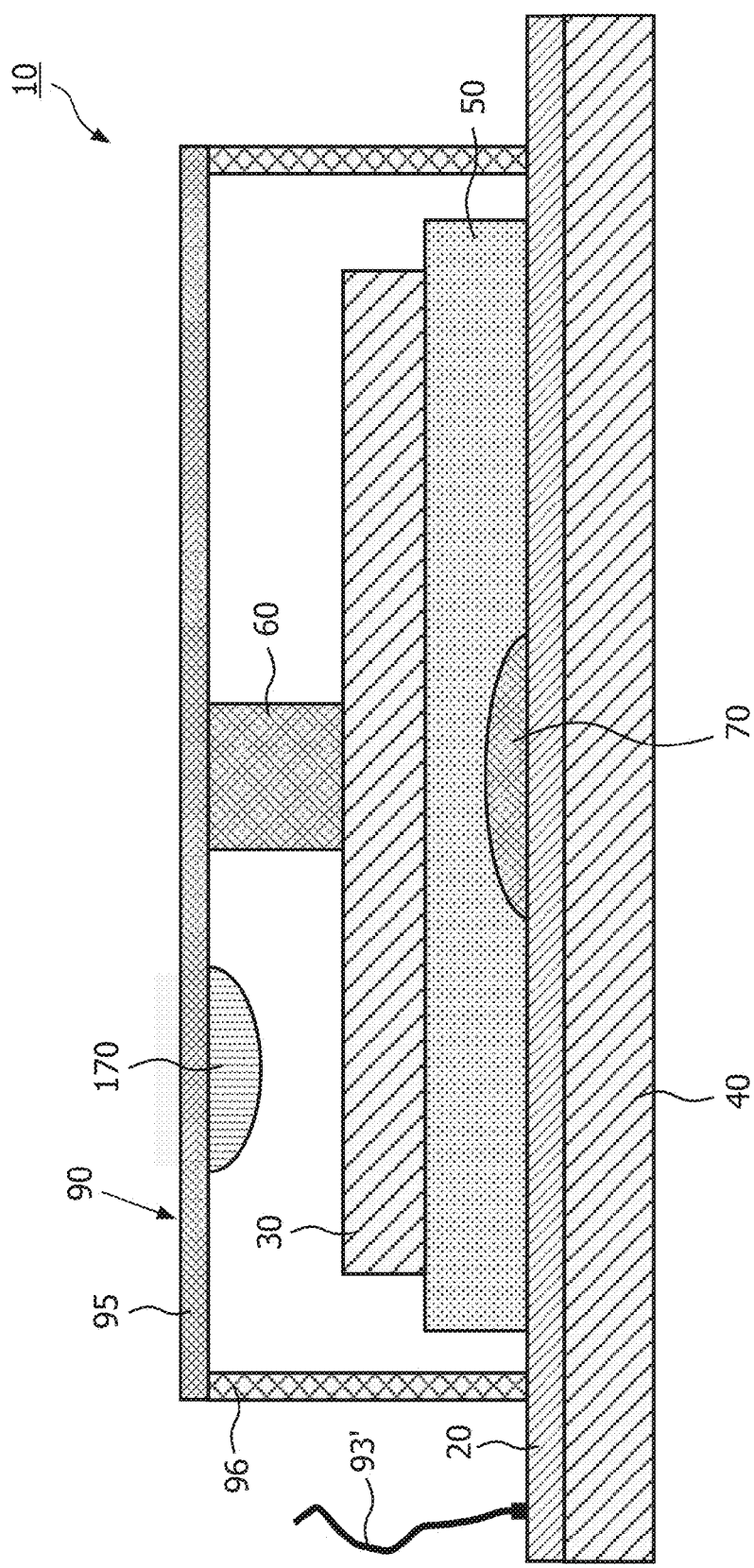
FIG. 1 a first embodiment of an electroluminescent device with a protective means according to the invention, FIG. 2 a top view of the electroluminescent device according to FIG. 1, FIG. 3 another embodiment of the electroluminescent device with a contact means, FIG. 4 the electroluminescent device with another embodiment of the contact means, FIG. 5 the electroluminescent device with a different embodiment of the contact means, FIG. 6 the electroluminescent device with a different embodiment of the contact means, FIG. 7 the electroluminescent device with a gas-tight feed through, FIG. 8 the electroluminescent device with an electrically conductive contact area, FIG. 9 the electroluminescent device with an additional embodiment of the contact means, FIG. 10 the electroluminescent device with a plurality of protective means, FIG. 11 a top view of the electroluminescent device according to FIG. 10, FIG. 12 a top view of the electroluminescent device with a segmented counter electrode, FIG. 13 the electroluminescent device according to FIG. 12 with electrically conductive contact areas, FIG. 14 the electroluminescent device according to FIG. 13 with another embodiment of the protective means, FIG. 15 a top view of the electroluminescent device according to FIG. 14, and FIG. 16 the electroluminescent device with the protective means and the contact means.

In FIG. 1 an electroluminescent device 10 according to a first embodiment of the invention is shown. The electroluminescent device comprises a substrate electrode 20, a counter electrode 30 and an organic electroluminescent layer 50 as the electroluminescent layer stack in this and the following examples. The organic electroluminescent layer 50 is arranged between the substrate electrode 20 and the counter electrode 30 forming a layer stack. This layer stack is arranged on a substrate 40. In the shown embodiment the substrate electrode 20 is formed by an approximately 100 nm thick layer of ITO, which is a transparent and conductive material. Onto this substrate electrode 20 the organic electroluminescent layer 50 is deposited. If a voltage is applied between the substrate electrode 20 and the counter electrode 30 some of the organic molecules within the organic electroluminescent layer 50 are exited, resulting in the emission of artificial light, which is emitted by the electroluminescent layer 50. The counter electrode 30 is formed by a layer of aluminum, working as a mirror reflecting the artificial light through the substrate electrode 20 and the substrate 40. To emit light into the surrounding, the substrate 40 in this embodiment is made of glass. Thus, the electroluminescence device according to FIG. 1 is a bottom emitting OLED. The electroluminescence device 10 shown in the following figures as well as its components and the components used in accordance with the invention are not shown true to the scale. Especially the thickness of the electrodes 20, 30, organic electroluminescence layer 50 and substrate 40 are not true to the scale. All figures just serve to clarify the invention.

The application of the contact means 60 to the counter electrode 30 may damage the thin layer of the counter electrode 30 and/or the organic electroluminescent layer 50. To use any kind of contact means and/or to reduce the complexity of the application of the contact means 60 to the counter electrode 30 the invention discloses a protective means 70. This protective means 70 is arranged on the substrate electrode 20. The protective means 70 is electrically non-conductive and is at least fully covering the area below the contact means 60. The area of the substrate electrode 20 below the contact means 60 covered by the protective means 70 (protective area) exceeds the area on the counter electrode 30 being in contact with the contact means 60 (contact area). However, it would be sufficient, if the protective area does not exceed the contact area, but is arranged fully below the contact area. The protective means 70 isolates the substrate electrode 20 from the contact means 60 and/or any parts of the counter electrode 30, which may be damaged from the application of the contact means 60 and may penetrate the organic electroluminescent layer 50. Therefore, application of the contact means 60 to the counter electrode 30 of the disclosed electroluminescent device 10 does not comprise the risk of producing a short.

The protective means 70 may comprise and/or consist of electrically non-conductive glue. As a number of tests have shown, commercially available non-conductive glue—like UHU plus schnellfest, curing time 5 minutes, a 2 component epoxy glue—can be attached to the substrate electrode 20. Such kind of non-conductive glue does not harm either the electrodes 20, 30 or the organic electroluminescent layer 50. By applying an electrically non-conductive glue as protective means 70 to the substrate electrode 20, a protective area is created in which a short is prevented, which might occur due to the fact that the contact means 60 is applied to the counter electrode 30. The contact means 60 might at least partially puncture the counter electrode 30 and the organic electroluminescent layer 50, leading to the possibility of an electrical contact of the counter electrode 30 and the substrate electrode 20. The protective means 70 protects the substrate electrode 20 from a direct contact with the contact means 60.

As can be seen in FIG. 1 the organic electroluminescent layer 50 and the counter electrode 30 are encapsulated by an encapsulation means 90. This encapsulation means 90 comprises a lid-like shape. Furthermore, the electroluminescent device 10 comprises at least one contact means 60, for electrically contacting the counter electrode 30 to an electrical source. The contact means 60 is therefore a part of the current path leading from the counter electrode 30 to the electrical source. In the embodiment shown the contact means 60 is a conductive post, applied to the counter electrode 30. This conductive post may comprise a metal or another conductive material known to the person skilled in the art.

In FIG. 1 the contact means 60 is in direct contact with the counter electrode 30 as well as with the encapsulation means 90. Therefore, it is easy to electrically connect the counter electrode 30 with an electrical source. The user just has to apply an electrically conductive means to the encapsulation means 90, which then bridges the gap to the contact means 60. In the shown embodiment the encapsulation means 90 is on the one hand connected to the substrate electrode 20 and on the other hand in contact with the contact means 60. To prevent a short at least a part of the encapsulation means 90 and/or the encapsulation means 90 as a whole must be insulated against the substrate electrode 20. In the shown embodiment a top 95 of the encapsulation means 90 is electrically conductive, whereas a side 96 of the encapsulation means 90 is electrically insulating. Therefore, a short between the counter electrode 30 and the substrate electrode 20 is prevented. Depending on the type of use the encapsulation means 90 may possess the following properties:

|   | Property of the top 95 of encapsulation means 90 | Property of the side 96 of encapsulation means 90 |
|---|---|---|
| 1. | conductive | conductive |
| 2. | insulating | conductive |
| 3. | conductive | insulating |
| 4. | insulating | insulating |

In the first case the encapsulation means 90 must be insulated against the substrate electrode 20. Therefore, an insulating rim 94—shown in FIG. 3—must be applied to the encapsulation means 90. In the third case there would be no need for any insulating rim 94, as the side 96 of the encapsulation means 90 insulates the conductive top 95 against the substrate electrode 20. In the second case an electrically conductive feed through may be applied to the insulating top 95 of the encapsulation means to connect it with the contact means 60. The same applies in the fourth case, in which in the side 96 as well as the top 95 of the encapsulation means 90 are insulating. The substrate electrode 20 is connected to a power source via the connection means 93'. Suitable connection means 93' are known be people skilled in the art.

The encapsulation means 90 has to be gas-tight to prevent ambient atmosphere from damaging the organic electroluminescent layer 50 or any of the two electrodes 20, 30 encapsulated in the encapsulation means 90. The shown electroluminescent device 10 furthermore may comprise a getter 170 arranged within the encapsulation means 90. This getter 170 is used to absorb humidity or other damaging gases, which happens to diffuse into a protected area within the encapsulation means 90. The getter 170 may comprise CaO or Zeolites. Other materials are known to a person skilled in the art.

Figure 2:
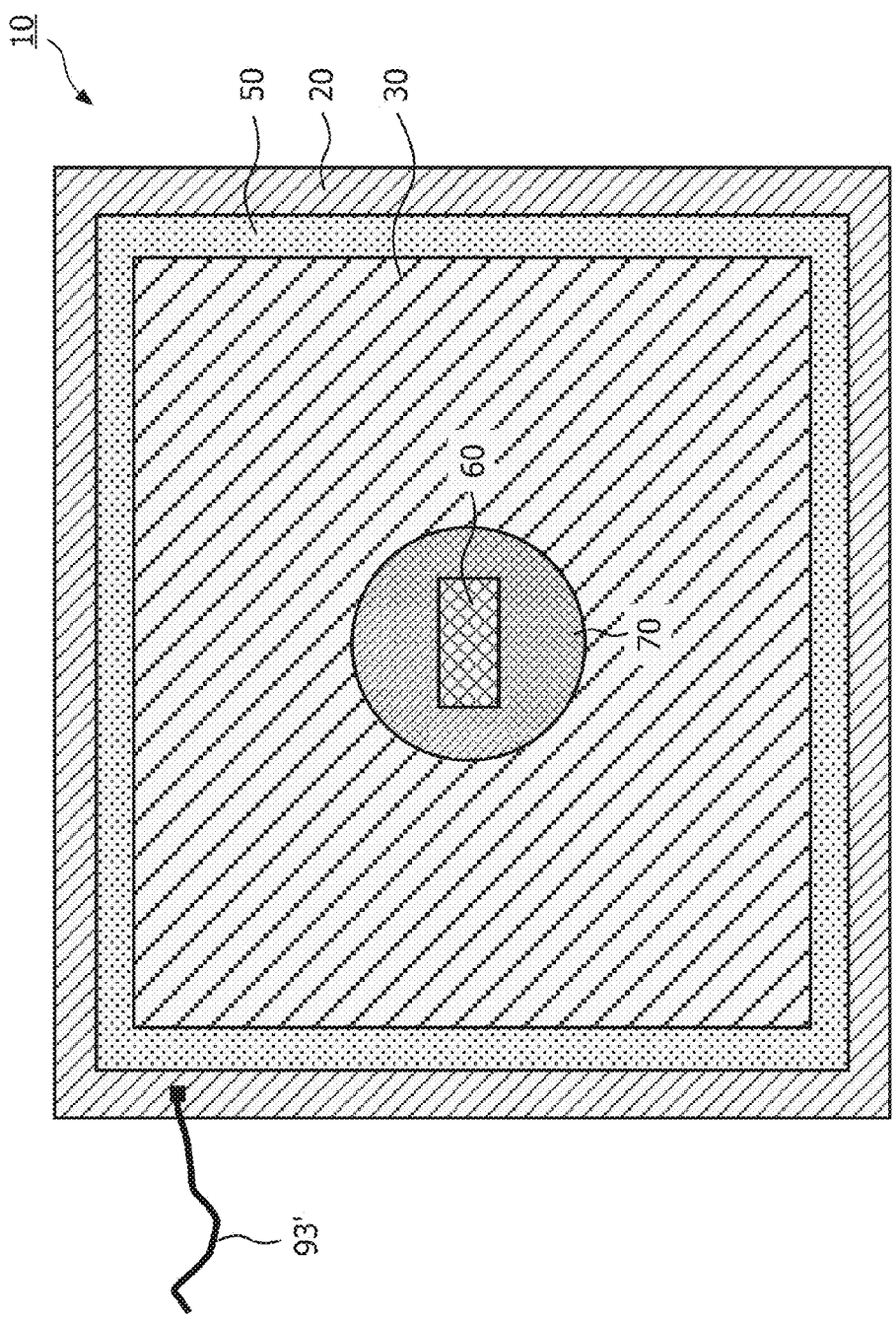

The FIG. 2 shows a view on the backside of the electroluminescent device 10 according to FIG. 1. For easier understanding, the electroluminescence device 10 is shown without the encapsulation means 90. The protective means 70 is arranged on the substrate electrode 20 and electrically non-conductive. It is the aim of the protective means 70 to protect the substrate electrode 20 against any influence from the contact means 60. Therefore, parts, e.g. extensions, of the contact means 60 penetrating the counter electrode 30 and the organic electroluminescent layer 50 will not reach the substrate electrode 20. Rather than that, they will be stopped by the protective means 70. Alternative, the protective means 70 may comprise a size, which limits the probability that the contact means 60 is the source of any short between the counter electrode 30 and the substrate electrode 20. Experiments have shown surprisingly non-conductive glue is a suitable material to be used as protective means 70. Therefore, a drop of non-conductive glue may be applied to the substrate electrode 20, before the organic electroluminescent layer 50 and the counter electrode 30 are deposited onto the substrate 40. The FIG. 2 shows the protective means 70 arranged beneath the organic electroluminescent layer 50 and the counter electrode 30. As can be seen, the protective means 70 is arranged below the contact means 60. Furthermore, the protective means 70 covers a protection area on the substrate electrode 20, which is larger than the contact area, covered by the contact means 60 on the counter electrode 20. Therefore, no influence of the connection means 60 to the counter electrode 20 and/or the organic electroluminescent layer 50 does lead to any kind of electrically conductive bridge to the substrate electrode 20. This is successfully prevented by the protective means 70.

Onto the substrate electrode a connection means 93' is applied. In all figures the connection means 93' of the substrate electrode 20 has the form of a wire attached to the substrate electrode 20. This should just symbolize the possibility to connect the substrate electrode 20 with the electrical source. Obviously the shown embodiment of the connection means 93' is just an exemplary design of such a connection means 93'. Other arrangements known to a person skilled in the art can also be used to connect the substrate electrode 20 to an electrical source.

Figure 3:
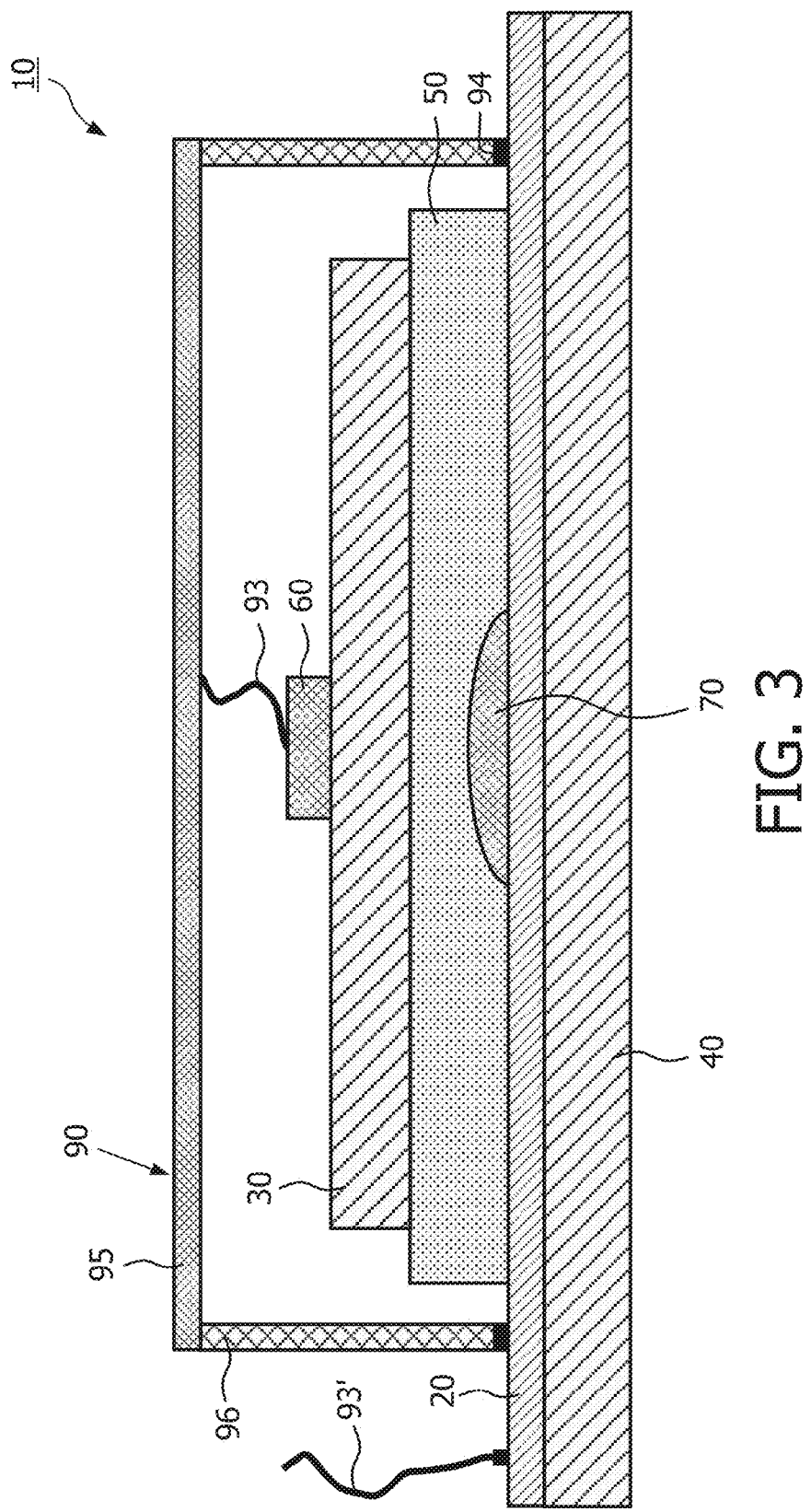

In FIG. 3 another embodiment of the disclosed electroluminescent device 10 is shown. Deviating from the electroluminescent device of FIG. 1 the contact means 60 has no direct contact with the top 95 of the encapsulation means 90. Rather than that, a connection means 93 is used. This connection means 93 may be a wire, but may also be any other means known by a person skilled in the art for bridging the gap between the conductive top 95 and the contact means 60. In the shown embodiment the top 95 as well as the side 96 of the encapsulation means 90 are electrically conductive. Therefore, the electroluminescent device 10 can be connected to an electrical source at any point of the encapsulation means 90. Due to its material property and/or size the encapsulation means 90 possesses a low resistance compared with the resistance of the counter electrode 30. Therefore, a user may take the most convenient section of the encapsulation means 90 to connect it with an electrical source. To prevent a short between the counter electrode 30 and the substrate electrode 20 an insulating rim 94 is applied to the electroluminescent device 10. This insulating rim 94 is arranged between the substrate electrode 20 and the side 96 of the encapsulation means 95. Therefore, there is no direct electrical contact between the substrate electrode 20 and the encapsulation means 90 nor the counter electrode 30. The protective means 70 is arranged on the substrate electrode 20 and is electrically non-conductive. Furthermore, it is arranged below the contact means 60, but may extend further. To prevent any occurrence of a short, at least one protective means 70 is arranged on the substrate electrode 20, wherein the protective means 70 is electrically non-conductive and is arranged at least partially below the contact means 60. Here the notation that the protective means 70 is arranged below the contact means 60 denotes that the area covered by the protective means 70 is at least fully below or may exceed the area, where the contact means 60 is or will be in contact with the counter electrode 30. So the protective means 70 comprises a size that enables it to at least fully cover the area needed by the contact means 60 on the counter electrode 30. Besides, the design and elements of the electroluminescent device 10 according to FIG. 3 are identical to those of FIG. 1.

Figure 4:
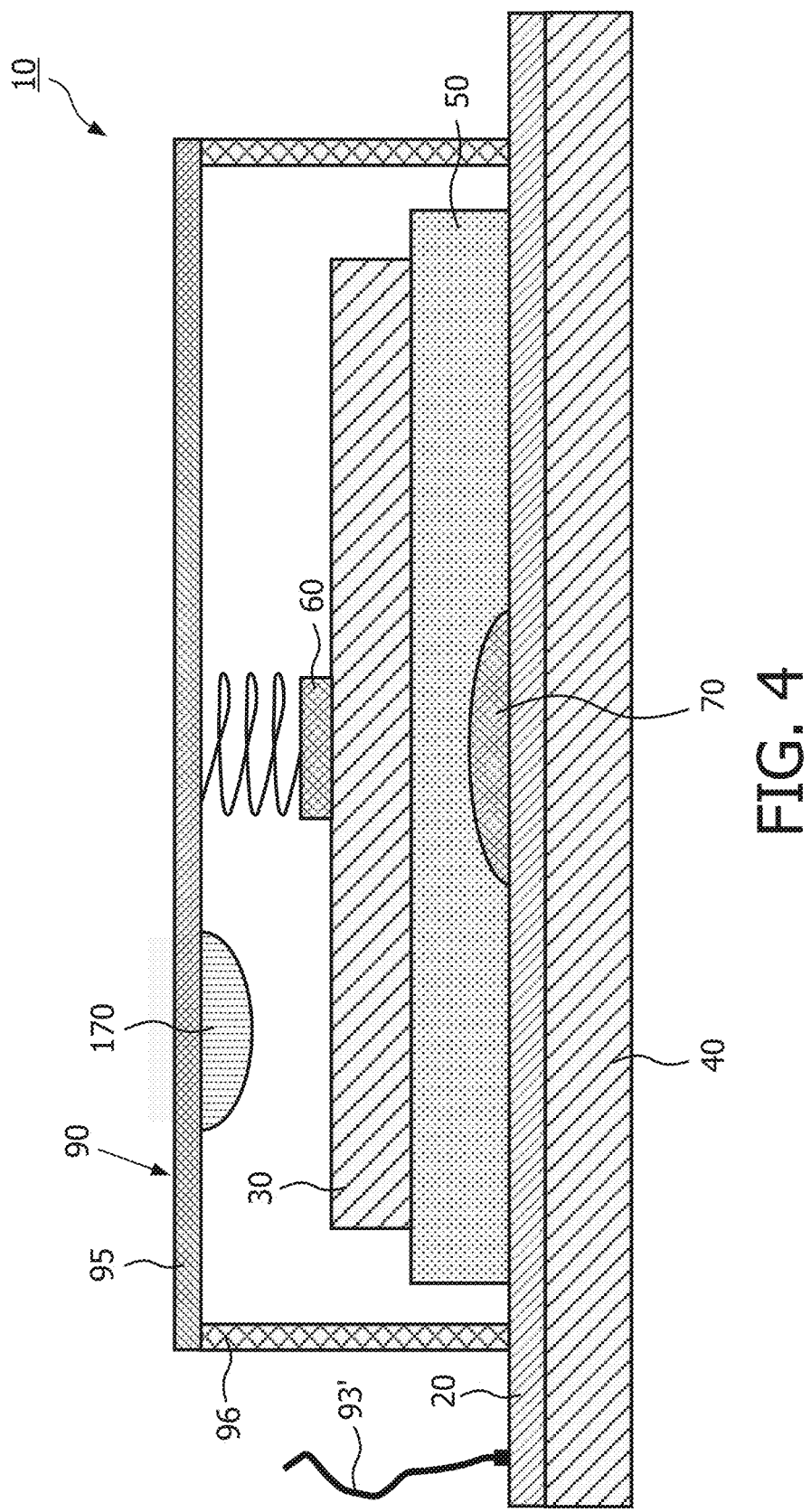

In FIG. 4 another embodiment of the contact means 60 is shown. In this embodiment the electroluminescent device 10 comprises a contact means 60, which is a spring. This spring is connected to the encapsulation means 90 and the counter electrode 30. Therefore, the top 95 of the encapsulation means 90 has to be conductive. To prevent a short the sides 96 of the encapsulation means 90 needs to be insulating. A spring may be used as a contact means 60 even if it may penetrates the counter electrode 30, as the protective means 70' prevents any kind of short. The contact means 60 will be stopped from the protective means 70 to get into direct contact with the substrate electrode 20. This embodiment has the advantage, that a user of the disclosed electroluminescent device 10 can use the outer side of the encapsulation means 90 to contact it to an electrical source. Therefore, a wire or other elements can easily be attached to the encapsulation means 90 to connect the stack of layers to an electrical source.

Figure 5:
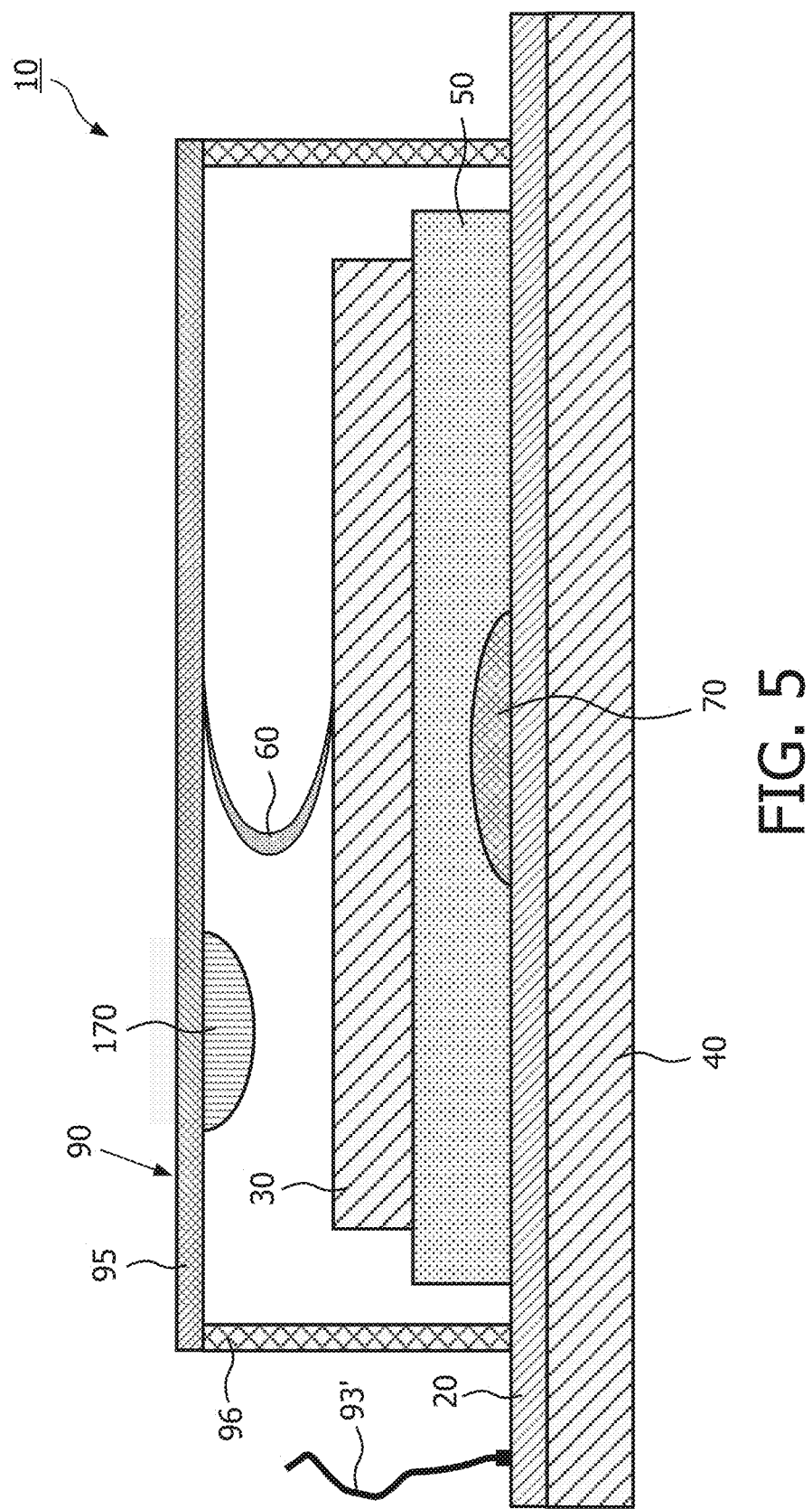

The electroluminescent device 10 shown in FIG. 5 differs from the electroluminescent device 10 of FIG. 4 by the design of the contact means 60. In FIG. 5 the contact means 60 comprises an arc-shaped spring, which is on the one hand connected to the encapsulation means 90 and on the other hand with the counter electrode 30. The top 95 of the encapsulation means 90 may again be used to connect the electroluminescent device 10 to an electrical source. To prevent a short the sides 96 of the encapsulation means 90 have to be insulating as they are in direct contact with the substrate electrode 20. The protective means 70 of the electroluminescent device 10 prevents direct contact of the substrate electrode 20 with the contact means 60 and/or the counter electrode 30.

Figure 6:
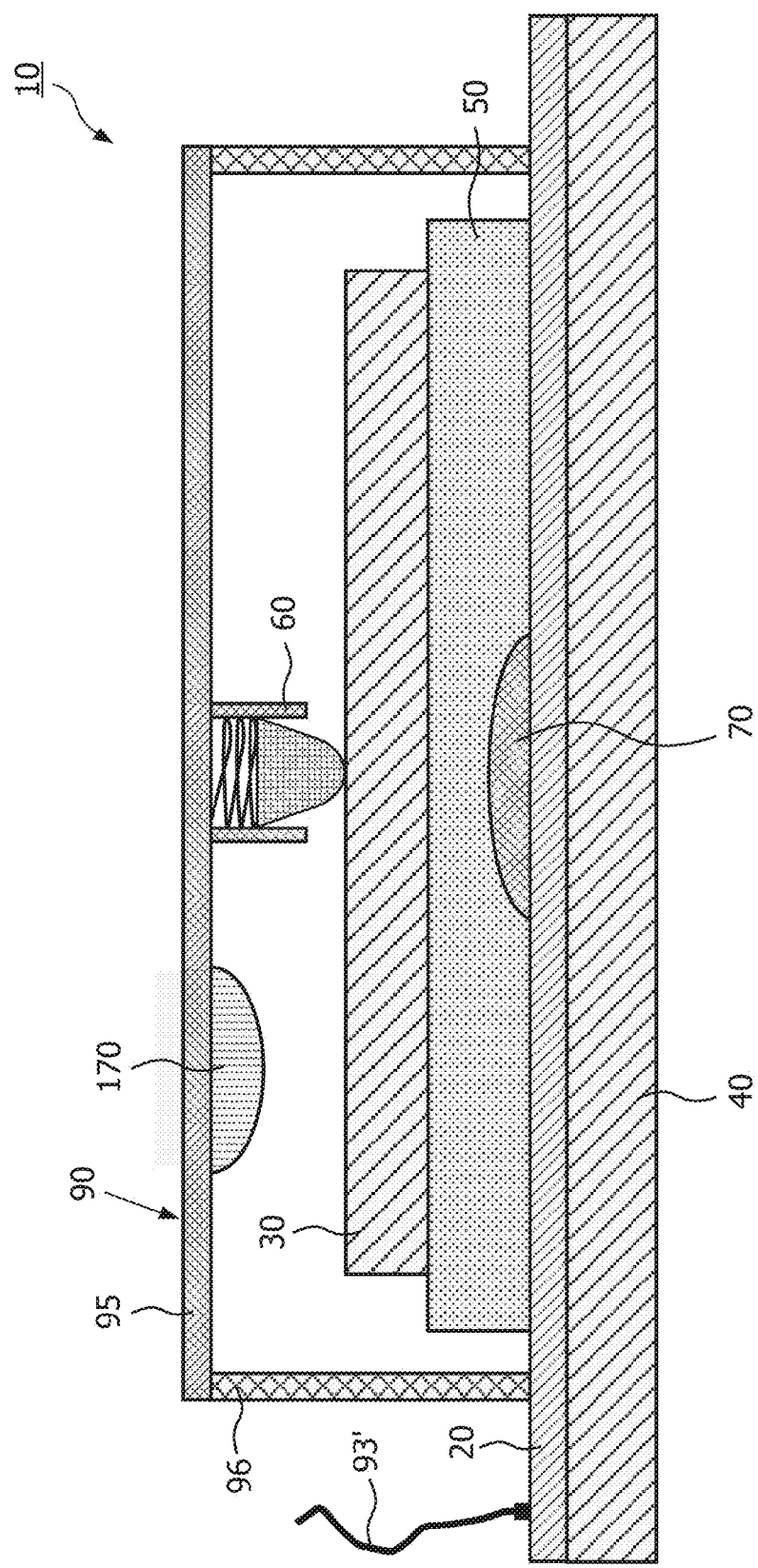

In FIG. 6 yet another embodiment of the contact means 60 is shown. In this embodiment the contact means 60 comprises a means with a rounded tip, which is pressed by a spring onto the counter electrode 30. The means with a rounded tip and the spring are arranged within a guidance to ensure that the contact means 60 does not slip to a side. As the means with a rounded tip is pressed onto the counter electrode 30 there is a probability that it may penetrate the counter electrode 30 and the organic electroluminescent layer 50 and reach the substrate electrode 20, which would lead to a short. To prevent this, the protective means 70 is arranged beneath the contact means. Even if the means with a rounded tip of the contact means 60 penetrates the counter electrode 30 and the organic electroluminescent layer 50 there would be no short. In the shown embodiment the area of the substrate electrode 20 below the contact means 60 covered by the protective means 70 (protective area) exceeds the area on the counter electrode 30 being in contact with the contact means 60 (contact area). However, it would be sufficient, if the protective area does not exceed the contact area, but is arranged fully below the contact area. All other features of the electroluminescent device 10 of FIG. 6 are in accordance with those of FIGS. 4 and 5.

Figure 7:
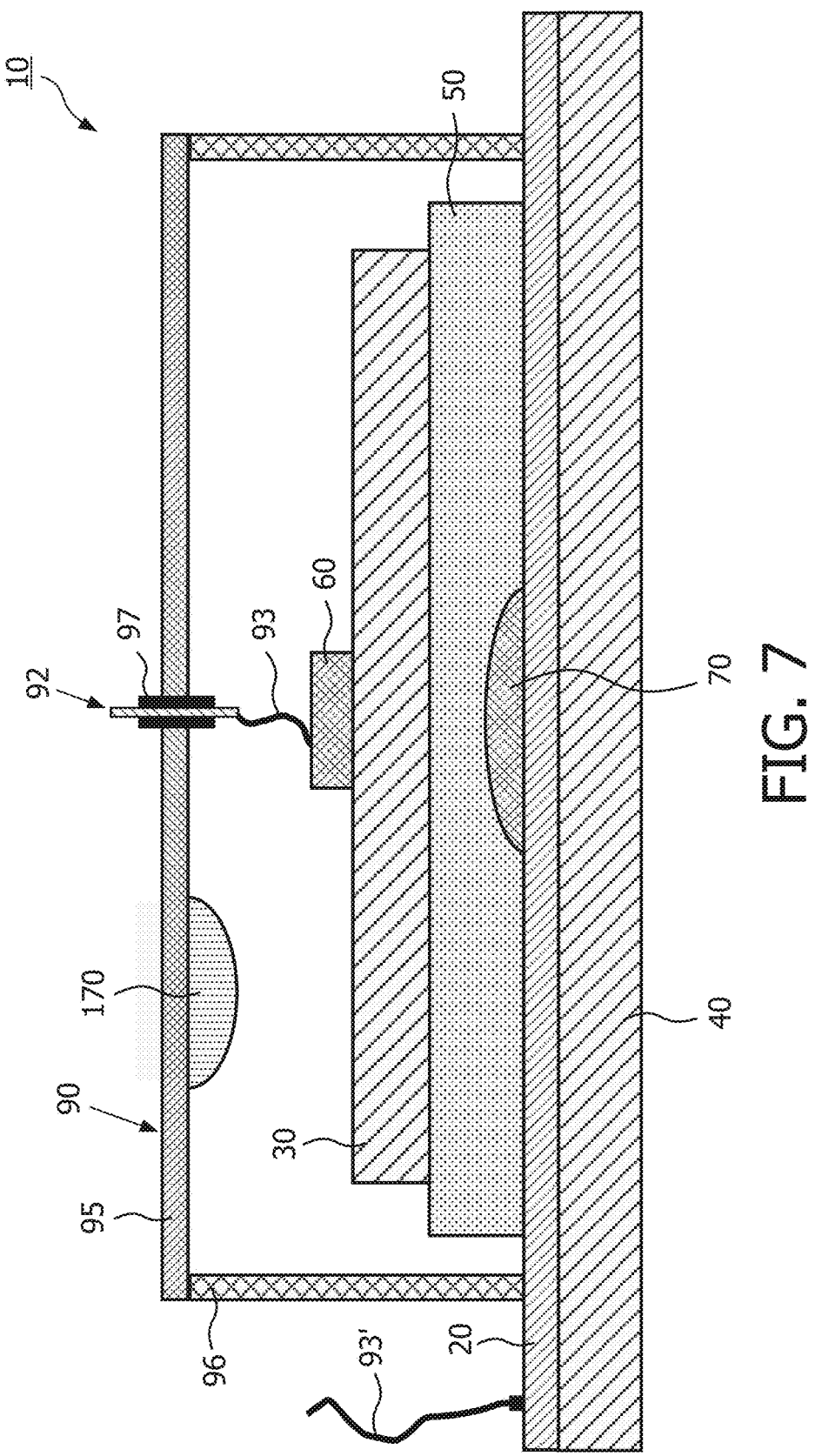

In FIG. 7 another embodiment of the encapsulation means 90 is disclosed. In this embodiment the encapsulation means comprises an electrically conductive gas tight feed through 92. This feed through 92 is connected to the contact means 60. This might—as shown—be done by a connection means 93, which is connecting on the one hand the feed through 92 and on the other hand with the contact means 60. The connection means 93 may be a wire, a foil or another electrically conductive element known to a person skilled in the art. It might also be that the feed through 92 is in direct contact with the contact means 60. On the outside of the encapsulation means 90, the gas tight feed through 92 may be contacted to an electrical source. In the shown embodiment it is assumed that the encapsulation means 90 as a whole is electrically conductive. Therefore, it is appropriate that the gas tight feed through 92 comprises an insulation means 97. This insulating means 97 prevents any short between the feed through 92—connected to the counter electrode 30—and the encapsulation means 90—connected to the substrate electrode 20. This insulating means 97 may be formed of ceramic, glass or made of re-melted glass-frit. If there is no insulating means 97 for the gas tight feed through 92, the top 95 of the encapsulation means 90 may also be insulating. Thus, a short between the two named electrodes 20, 30 is also prevented. The protective means 70 is arranged fully below the area of the contact means 60, but it may be extended beyond this area. In the shown embodiment the protective means 70 occupies a larger area on the substrate electrode 20 than the contact means 60 on the counter electrode 30. This ensures that no piercing of the counter electrode 30 and the organic electroluminescent layer 50 by the contact means 60 will lead to a short, as the piercing part will be stopped by the protective means 70. Besides, the design and elements of the electroluminescent device 10 according to FIG. 7 are identical to those of FIG. 1.

Figure 8:
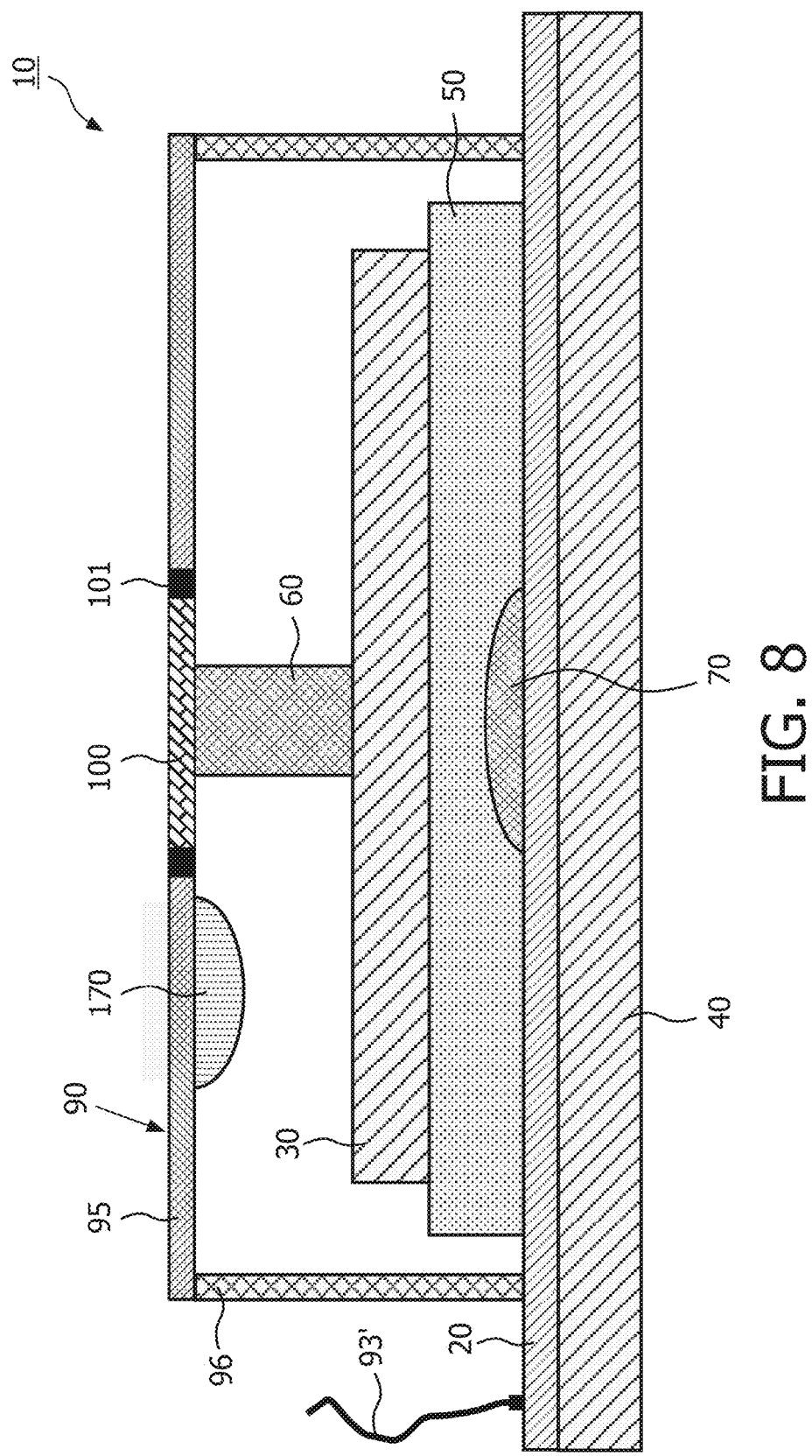

In FIG. 8 another preferred embodiment of the electroluminescence device 10 is shown. This electroluminescence device 10 comprises a stack of layers formed by the counter electrode 30, the organic electroluminescence layer 50 and a substrate electrode 20. On the backside of counter electrode 30 the contact means 60 is applied. This contact means 60 is an electrically conductive post applied to the counter electrode 30. The protective means 70 is arranged below the contact means 60. The encapsulation means 90 comprises an electrically conductive contact area 100. As can be seen in FIG. 8 the contact means 60 is in direct contact with the contact area 100 of the encapsulation means 90. The user of the electroluminescence device 10 according to FIG. 8 just has to connect the contact area 100 with an electrical source to generate artificial light. As the contact area 100 is more robust and larger than the contact means 60 and/or the counter electrodes 30 the connection to the electrical source can easily be done with known means. For example a wire can be attached to the contact area 100 of the encapsulation means 90. The contact area 100 may be formed by a metal disk embedded in the encapsulation means 90. This metal disk is electrically conductive and may therefore be used as a bridge between the contact means 60 and the electrical source. In the shown embodiment the encapsulation means 90 is positioned onto the substrate electrode 20 and also electrically conductive. To prevent a short, the encapsulation means 90 comprises an insulating border 101, which encircles the contact area 100. This prevents any direct contact between the contact area 100 and the top 95 of the encapsulation means 90. Apart from the shown embodiment, the contact area 100 may not only be formed by a disk embedded in the encapsulation means 90. It might also be that the encapsulation means 90 is a one piece element, which is partially doped with conductive particles, so that the conductive area 100 is formed. In this embodiment the rest of the encapsulation means, which is not conductive, insulates the contact area 100 against the substrate electrode 20.

Figure 9:
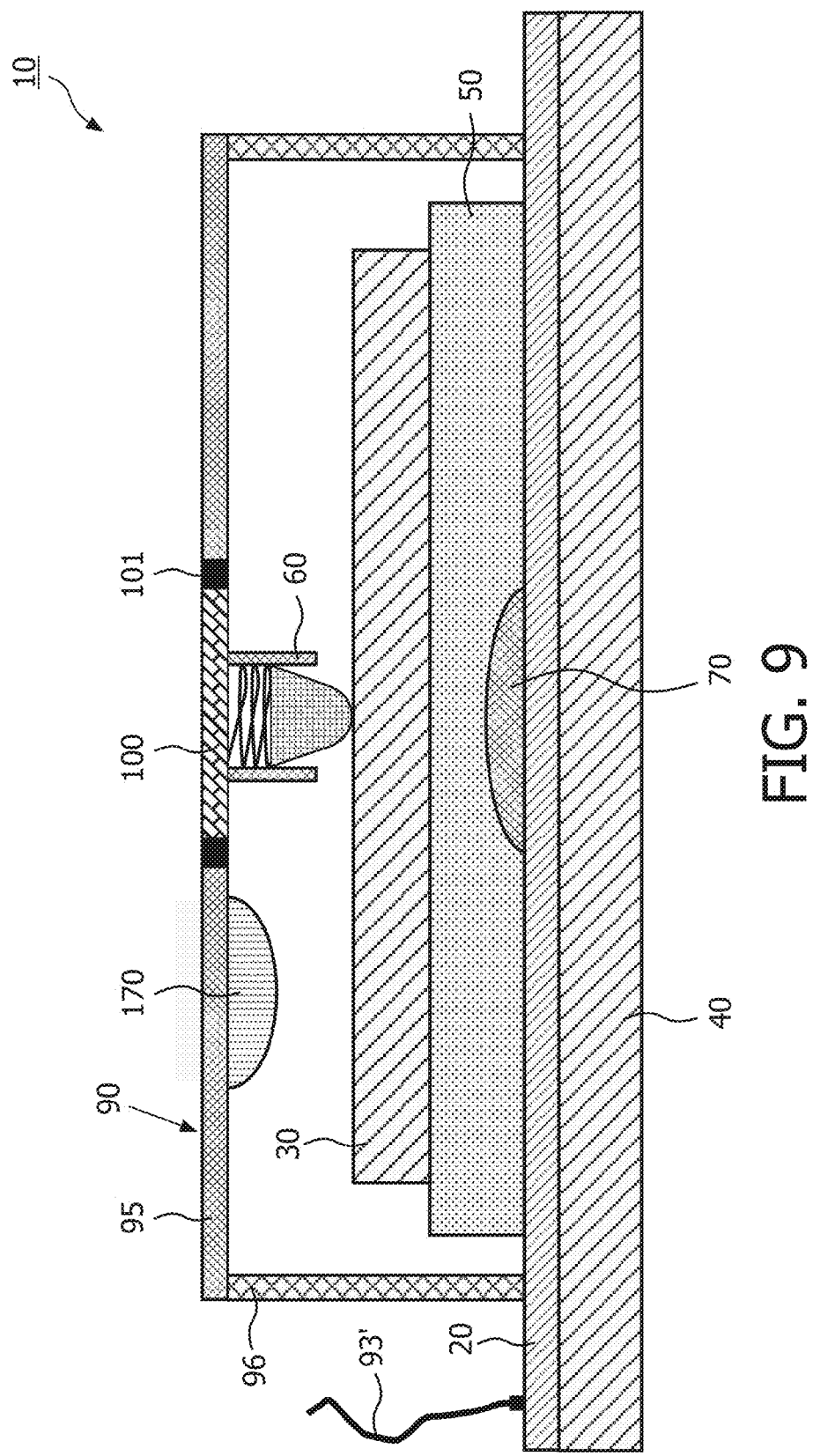

In FIG. 9 another embodiment of the electroluminescent device 10 is shown. The shown electroluminescent device 10 comprises an encapsulation means 90 with a contact area 100. The contact area 100 comprises insulating borders 101, which prevents a short between the two electrodes 20, 30. Inside the encapsulation means 90 and beneath the contact area 100 the contact means 60 is arranged. This contact means 60 comprises a means with a rounded tip, which is pressed by a spring onto the counter electrode 30. A guiding ensures, that the means with a rounded tip is pressed onto the counter electrode 30. Such a design of the contact means 60 has the advantage that it can be used for devices with different spacing between counter electrode 30 and encapsulation means 95. The protective means 70 is arranged on the substrate electrode 20, wherein the protective means 70 is electrically non-conductive and is at least fully covering the area below the contact means 60.

Figure 10:
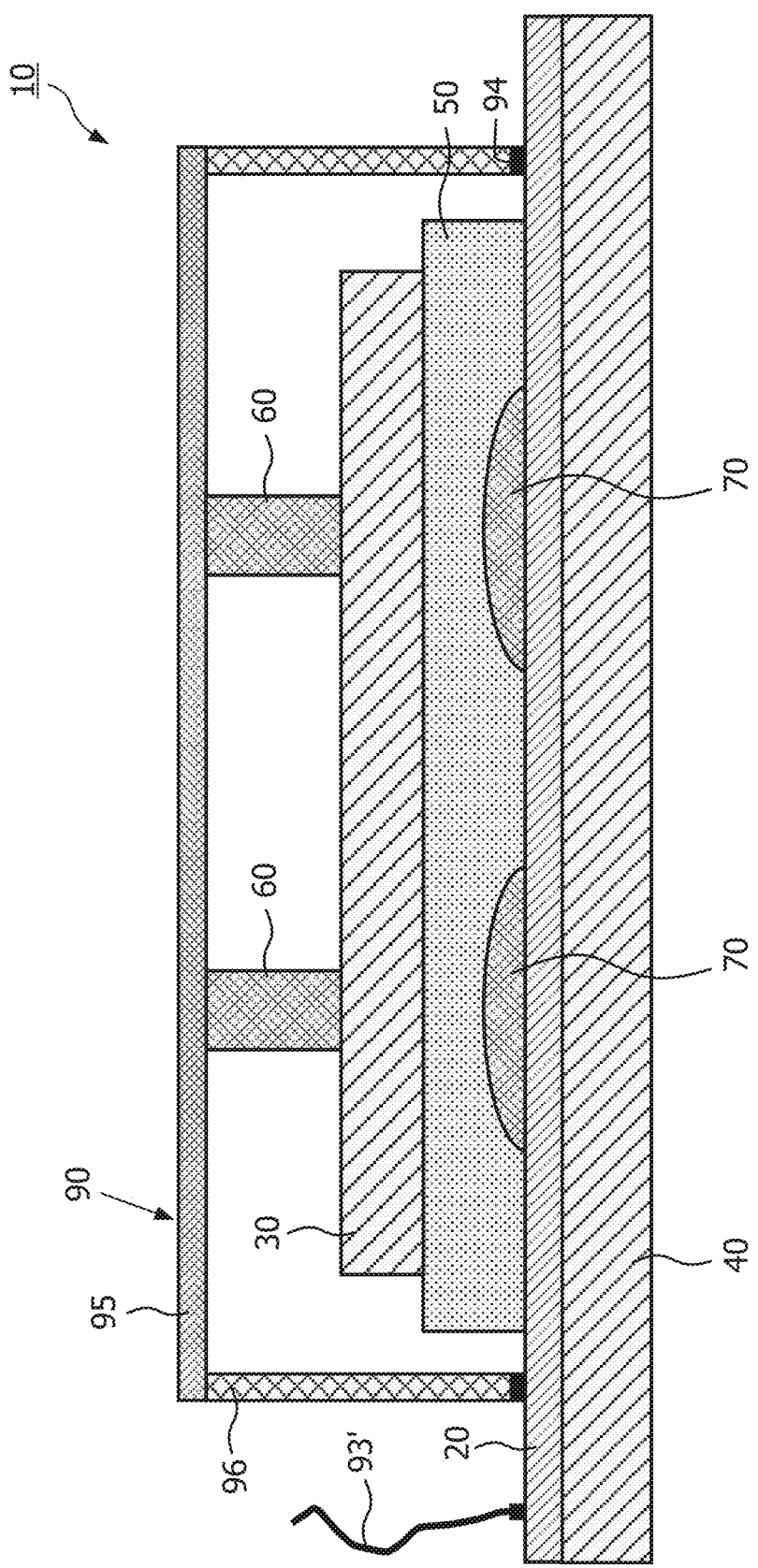

FIG. 10 shows an electroluminescent device 10 with two contact means 60. Beneath each of the contact means 60 a protective means 70 is arranged. The contact means 60 fills the gap between the counter electrode 30 and the encapsulation means 90. The contact means 60 extends towards the top 95 of the encapsulation means 90. In the shown embodiment the top 95 and the side 96 of the encapsulation means 90 are electrically conductive. Therefore, it is easy to connect the counter electrode 30 to an electrical source. The encapsulation means 90 can be connected in known manner to an electrical source. Due to the fact, that four contact means 60 are used to contact the counter electrode 30, a homogenous distribution of the voltage across the counter electrode 30 is achieved. This will result in a homogenous generation of artificial light by the organic electroluminescence layer 50. As the encapsulation means 90 as a hole is conductive, an insulating rim 94 has to be arranged between the encapsulation means 90 and the substrate electrode 20. This ensures that no short occurs.

Figure 11:
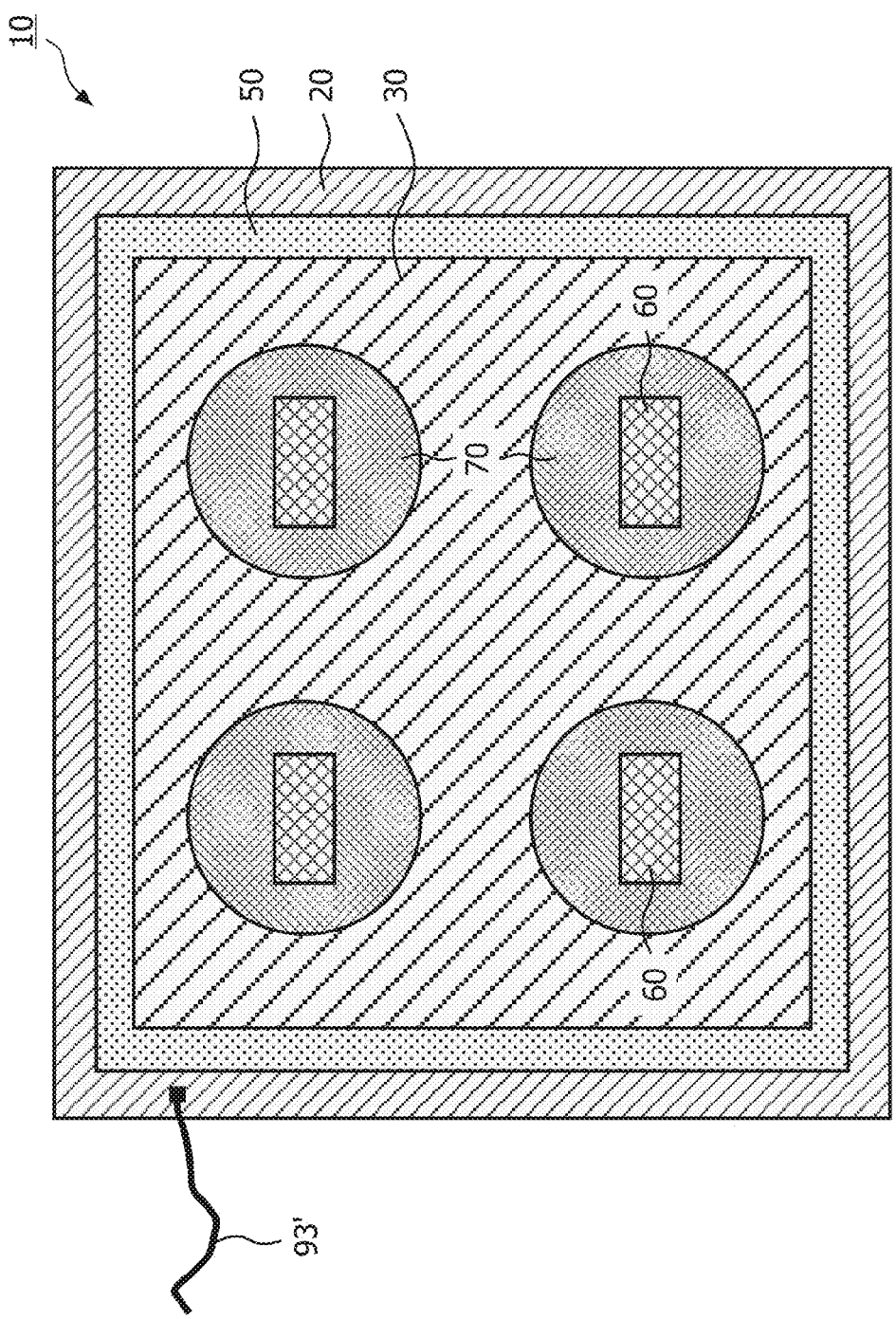

The FIG. 11 shows a top view of the electroluminescent device 10 according to FIG. 10. Here four contact means 60 are applied to the counter electrode 30. With the help of these four contact means 60 a more homogenous distribution of the voltage and/or the current in the electroluminescent device 10 may be achieved. For easier understanding, the electroluminescence device 10 in FIG. 11 is shown without the encapsulation means 90. As can be seen each of the contact means 60 possesses its own protective means 70. The protective means 70 are arranged beneath the contact means 60.

Figure 12:
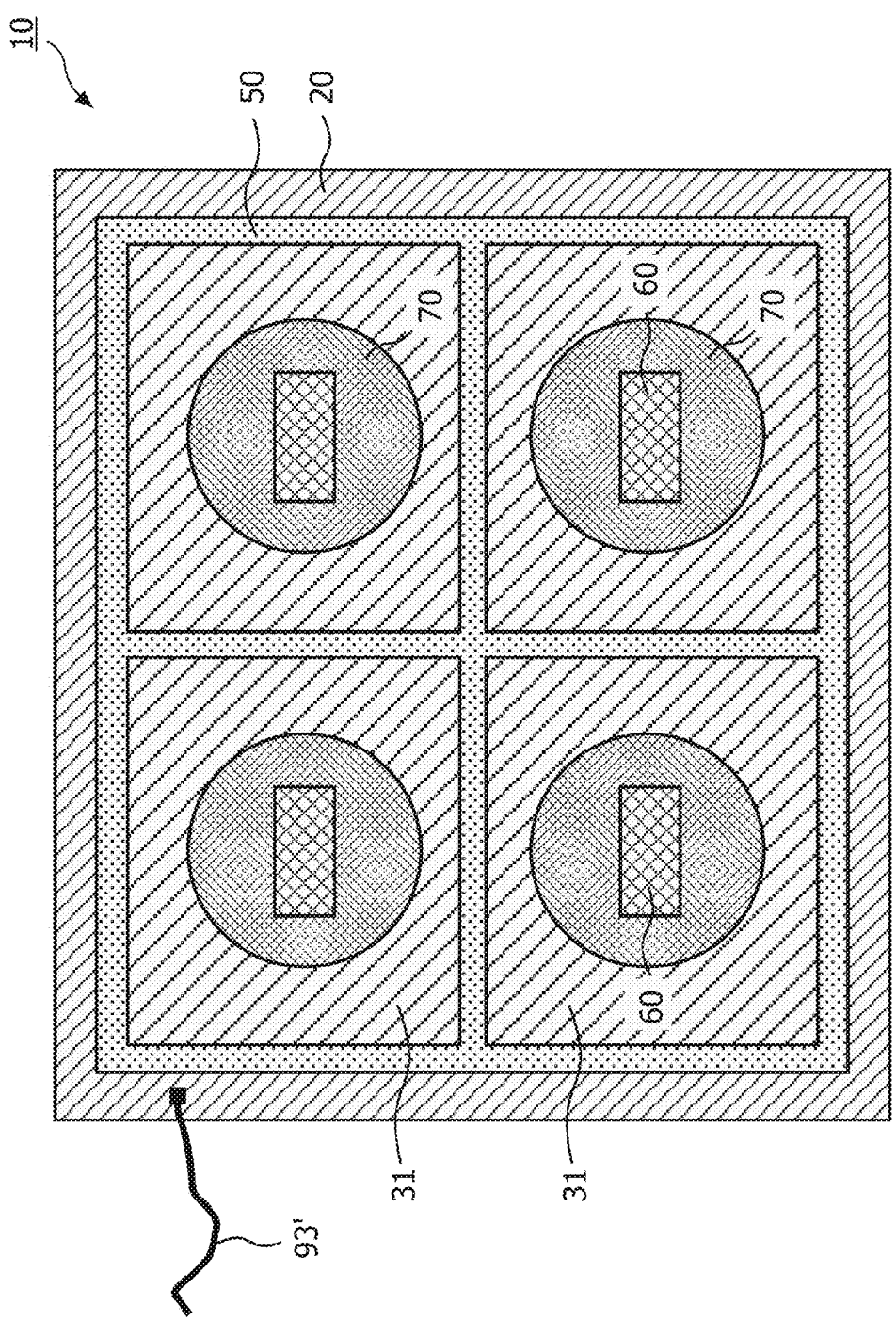
Figure 13:
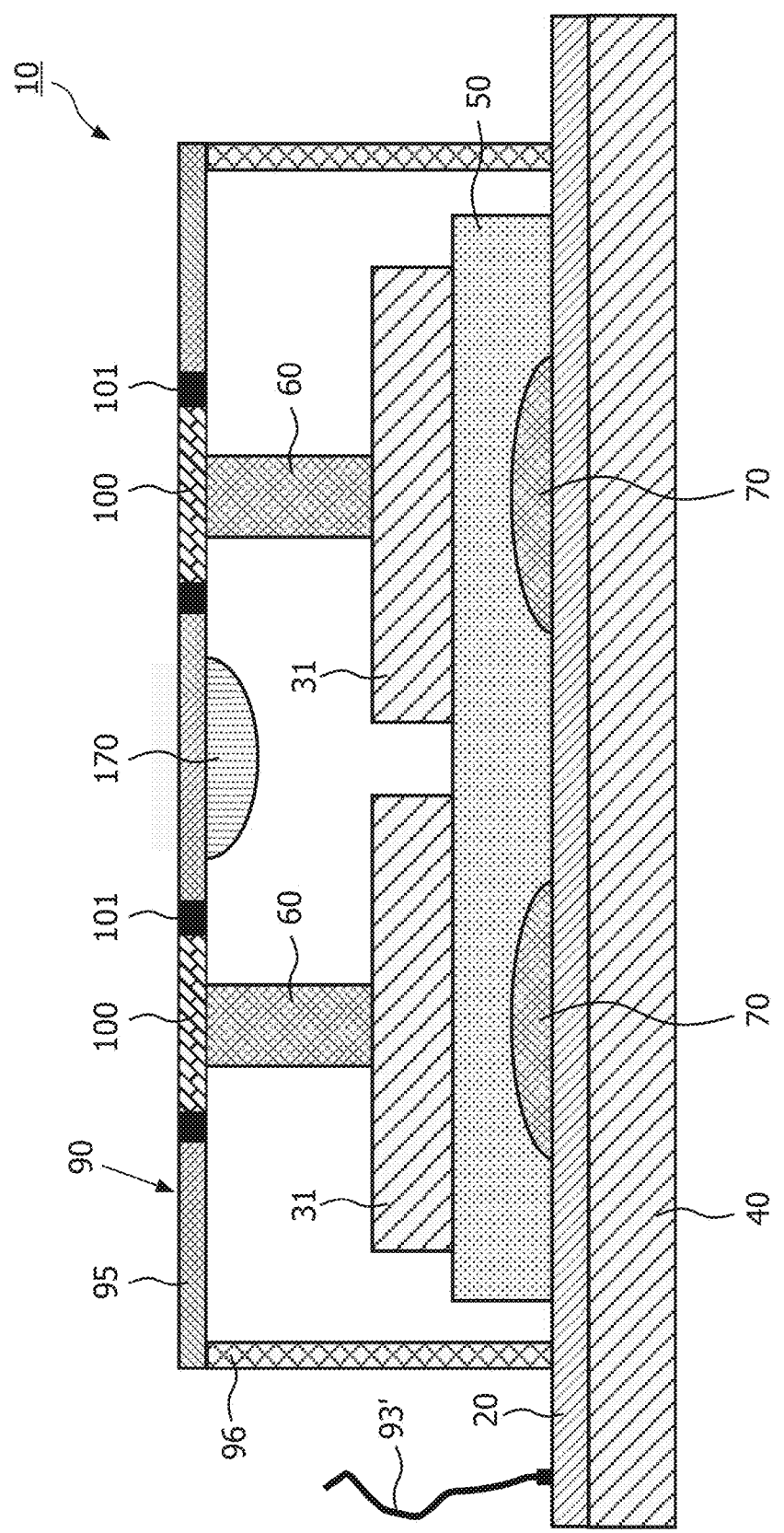

In another preferred embodiment the counter electrode 30 is structured in a plurality of electrically separated counter electrode segments 31. This should be illustrated by the FIGS. 12 to 15. In FIG. 12 a top view on an electroluminescence device 10 is shown. For easier understanding the electroluminescence device 10 is shown without the encapsulation means 90. As can be seen the counter electrode 30 is separated into four segments 31, which are not electrically connected, as can be seen from FIG. 12. Each segment 31 of the counter electrode 30 possesses its own contact means 60. FIG. 13 shows that the contact mean 60 is applied in such a way, that it has direct contact to the encapsulation means 90. The encapsulation means 90 possesses for each of the contact means 90 one contact area 100. These contact areas 100 are electrically conductive and can be used to feed the layer stack with electrical current. As the encapsulation means 90 is directly mounted on the substrate electrode 20 each of the contact area 100 possesses an insulating border 101 to prevent a short. A user of the shown electroluminescence device 10 is able to individually connect each contact area 100 to an electrical source. Therefore, it is possible to activate just parts of the electroluminescence device 10. Depending on the counter electrode segment 31, which is supplied with electrical current, only the part of the organic electroluminescence layer 50 under this counter electrode segment will emit artificial light. As can be seen, each of the contact means 60 possesses its own protective means 70 arranged on the substrate electrode 20. Each of the electrically non-conductive means 70 prevents a short. All other features of the electroluminescence device 10 are in correspondence with electroluminescence device 10 according to FIG. 1.

Figure 14:
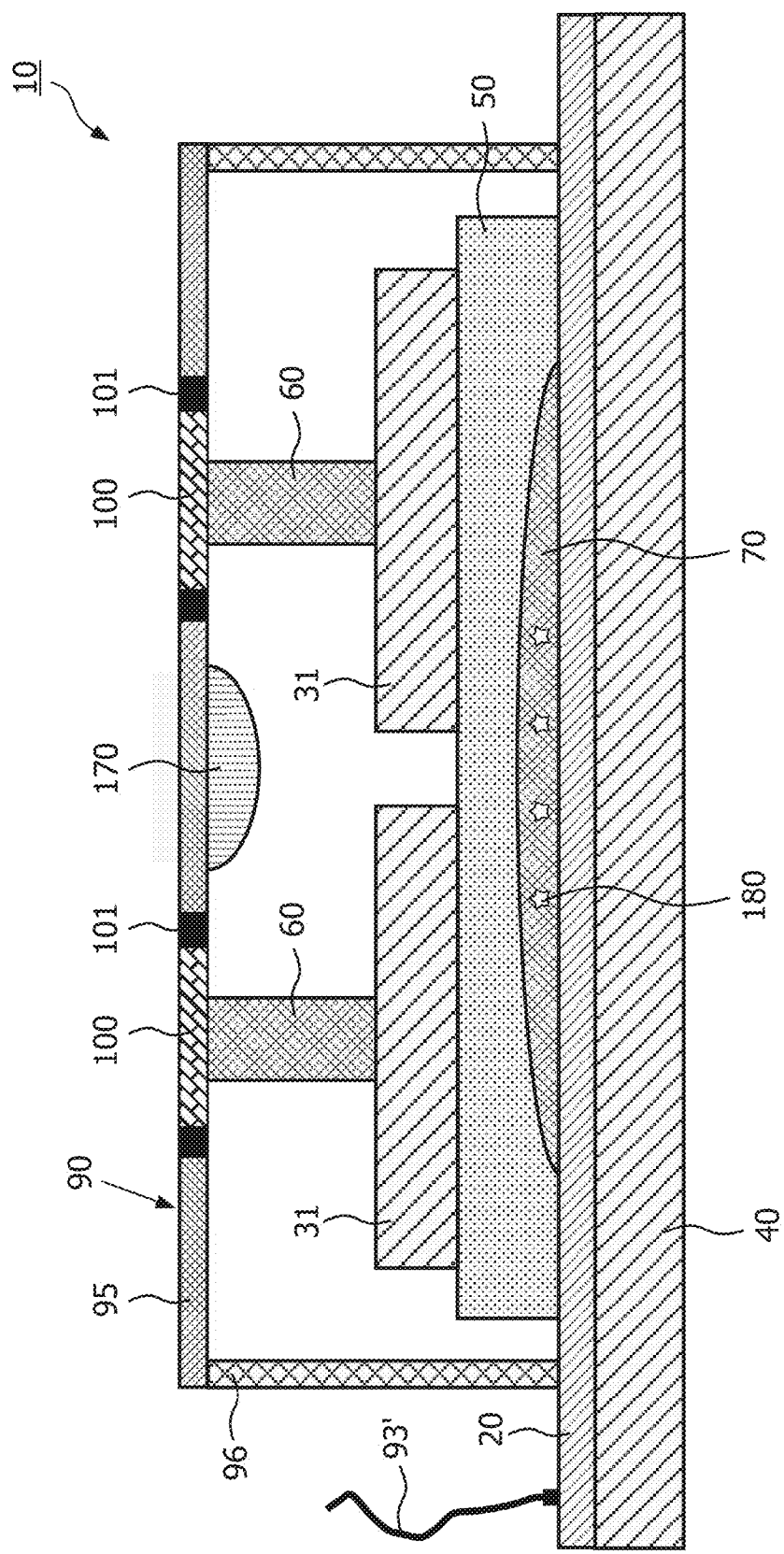

FIG. 14 shows the same electroluminescence device 10, but this time, the protective means 70 is designed in a way, that it is arranged beneath two contact means 60. Therefore, not only one small protective means 70 is applied to the counter electrode. If for example non-conductive glue is used for the protective means 70, it can be applied bank-like onto the substrate electrode 20. It is therefore easier to apply to the substrate electrode 20 and can be used to protect the electroluminescence device 10 against shorts for a plurality of contact means 60. Furthermore, it is preferable that the protective means 70 comprises at least one scattering means 180, for scattering a light, generated by the organic electroluminescent layer 50. The scattering means 180 may comprise and/or be pigments and/or particles. This prevents that the area beneath the protective means 70 might appear darker than its surrounding. These scattering means 180 may comprise mica or aluminum flakes or a material with a high refractive index like $TiO_2$ particles. The scattering means 180 also reflect parts of the artificial light and/or of visible light guided in the substrate 40 and therefore brighten the otherwise non-emissive layer beneath the protective means 70. All other features of the electroluminescence device 10 are in correspondence with electroluminescence device 10 according to FIG. 13.

Figure 15:
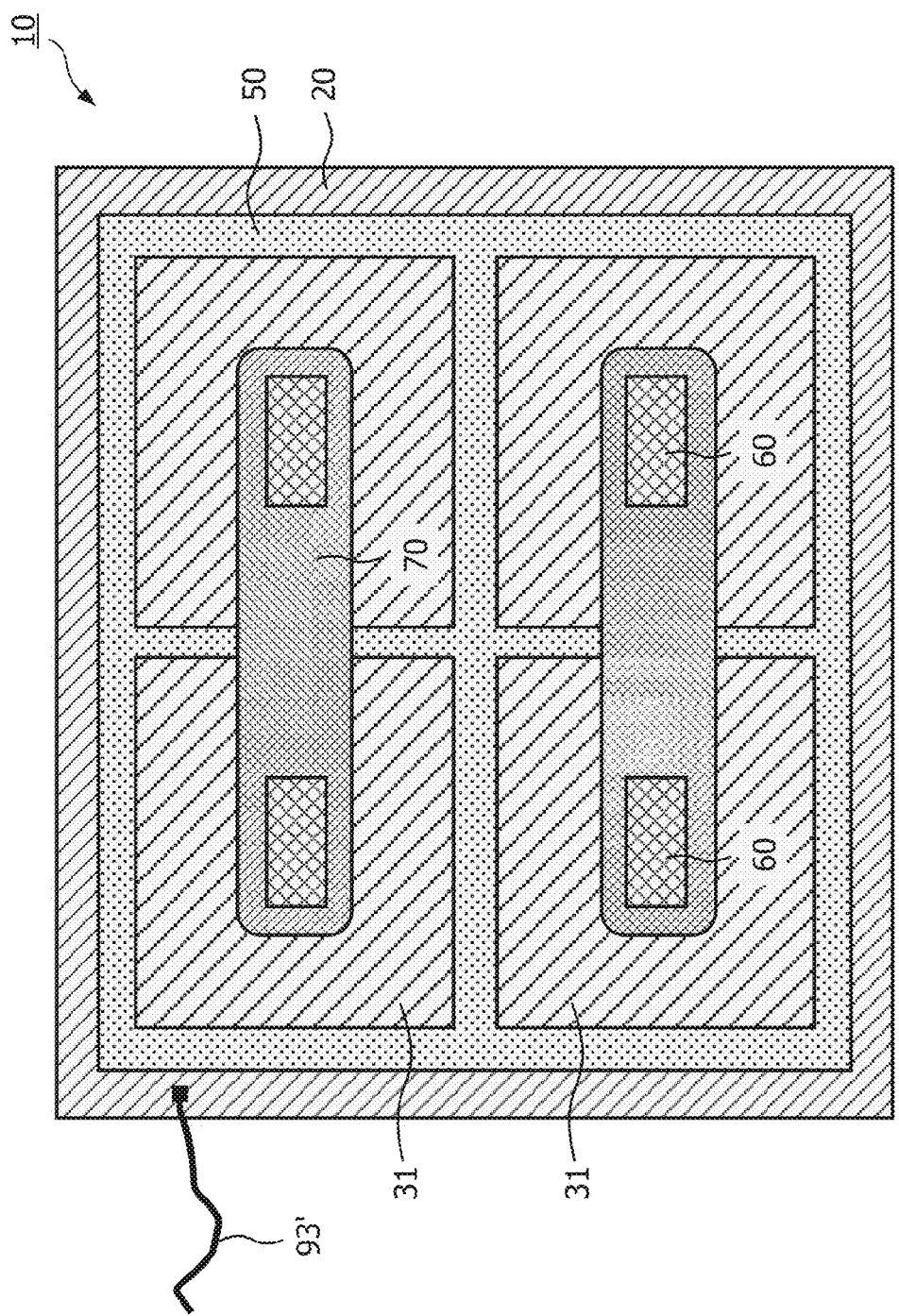

The FIG. 15 shows a top view of the electroluminescent device 10 according to FIG. 14. Here four contact means 60 are applied to the counter electrode 30. Beneath two contact means 60 a single elongated protective means 70 is shown. For easier understanding, the electroluminescence device 10 in FIG. 15 is shown without the encapsulation means 90.

Figure 16:
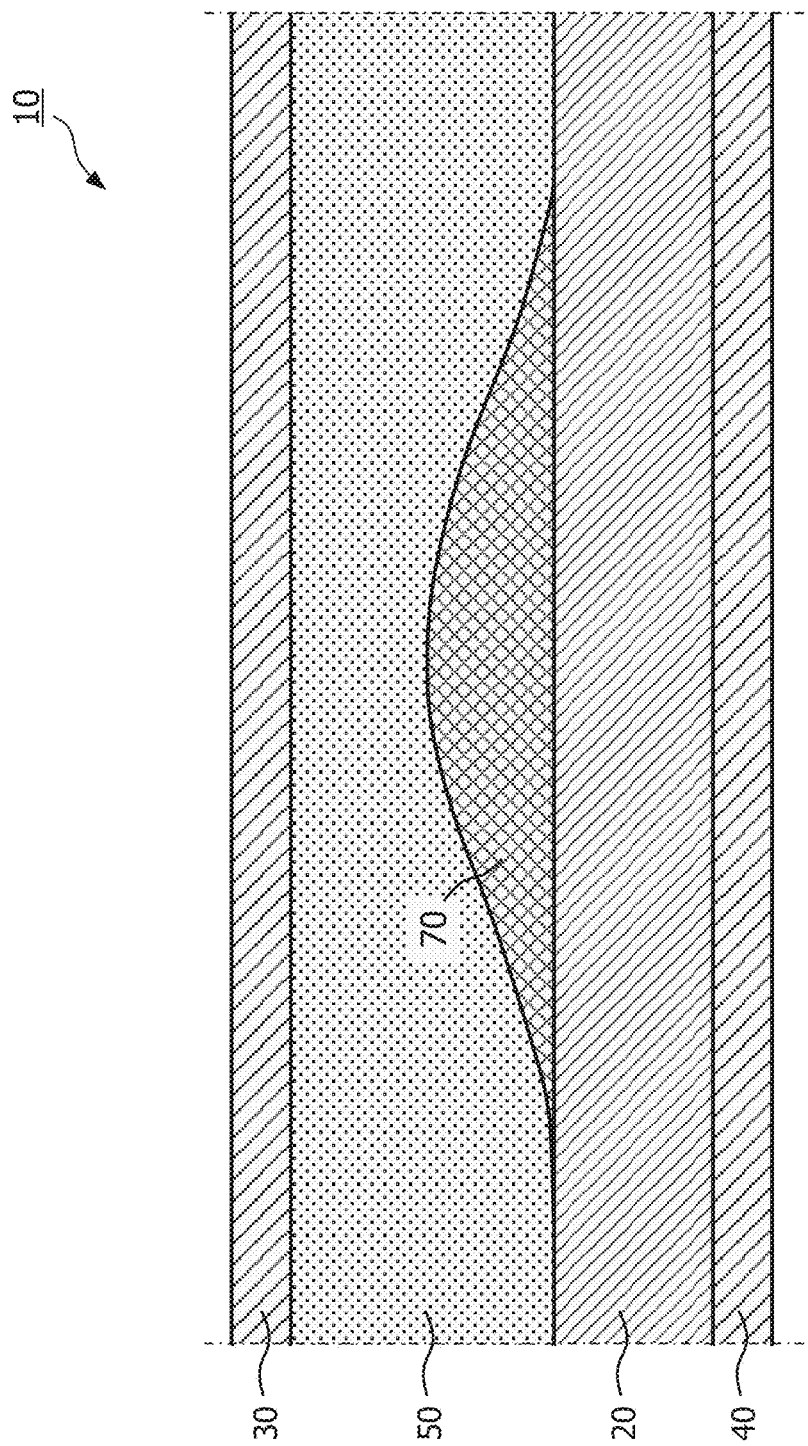

In FIG. 16 a part of the electroluminescence device 10 is shown. The FIG. 16 is a magnification of the layers deposited on the substrate. It shall be noticed, that the size of the layers are not true to the scale. Onto the substrate 40 the substrate electrode 20 is deposited. Onto this substrate electrode 20 the protective means 70 is arranged. The protective means 70 is covered by the organic electroluminescence layer 50 and the counter electrode 30. Onto this organic electroluminescence layer 50 the counter electrode 30 is deposited. To connect the counter electrode 30 to an electrical source contact means have to be applied (not shown here). In the shown embodiment the protective means 70 comprises non-conductive glue. The different electrodes 20, 30 and the electroluminescence layer 50 are applied in layers to the substrate 40. After applying the substrate electrode 20, the protective means 70 has to be deposited onto the substrate electrode 20. The protective means 70 has to have material properties and/or application procedure that prevents the emergence of a shadowing edge on the substrate electrode 20. In a preferred embodiment the material property is low viscosity. Therefore, the material forming the protective means will flow on the substrate electrode 20, forming a hill-like structure with smooth slopes. There will be no shadow edges, which could prevent a continuous coverage of the organic electroluminescence layer 50 and the counter electrode 30. The protective means 70 preferably has a lower viscosity at enhanced temperature that enables a two step application. In a first step the material forming the protective means—like non-conductive glue—is applied to the substrate electrode 20 in the desired position. Then the substrate is heated to an enhanced temperature. Due to its lower viscosity, the material of the protective means 70 will then flow out on the substrate electrode. Preferably the material of the protective means 70 comprises a viscosity that enables it to flow slowly, to form a protective means 70 with a defined thickness and smooth slopes. As the temperature of the protective means and/or the material of the protective means decreases, it should solidify, to form the protective means 70. This ability and/or material property of the protective means to flow onto the substrate electrode 20 in such a way, that no shadowing edges are formed enables the manufacturing of the disclosed electroluminescence device 10

In an experiment, the protective means was made of a two-component epoxy glue (UHU plus schnellfest, curing time 5 min) The binder and the hardener were mixed in the prescribed ratio of 1:1 and then applied at room temperature to the ITO-covered glass substrate in one spot. Then the substrate was heated on a hot plate to 60° C. for 15 min, which allowed the glue first to flow into a smooth hill and then to solidify rapidly. The procedure was carried out in a glove box in dry Nitrogen atmosphere (less than 1 ppm of water). The substrate with the hardened protective means was then introduced into a vacuum chamber and the organic layers and the counter electrode were deposited. The finished device was then encapsulated with a glass cover lid having a hole at the position of the protective means. The cover was applied by UV curing glue. A getter for water was placed in the cavity formed by the substrate and the lid. In a last step, a contact means—a brass plate with a small brass spring—was applied though the hole in the cover lid to the counter electrode at the position of the protective means. After setting of all glues (appr. 1 hour), the OLED was reliably driven by connecting the plus lead of a power supply to the rim of the substrate where the substrate electrode was exposed and the minus lead to the brass plate on the cover lid. The electroluminescent layer stack and the counter electrode made of Aluminum covered the protective means without cracks or holes. At the position of the protective means, there was no light emission.

In a second experiment, the binder of the glue was mixed with TiO$_2$ particles, leading to a white substance. The rest of the procedure followed exactly the description give above. After setting of all glues (appr. 1 hour), the OLED was reliably driven by connecting the plus lead of a power supply to the rim of the substrate where the substrate electrode was exposed and the minus lead to the brass plate on the cover lid. The electroluminescent layer stack and the counter electrode made of Aluminum covered the protective means without cracks or holes. At the position of the protective means, there was no light emission due to the scattering of the light guided in the substrate by the TiO$_2$ particles embedded in the glue.

Figure 17:
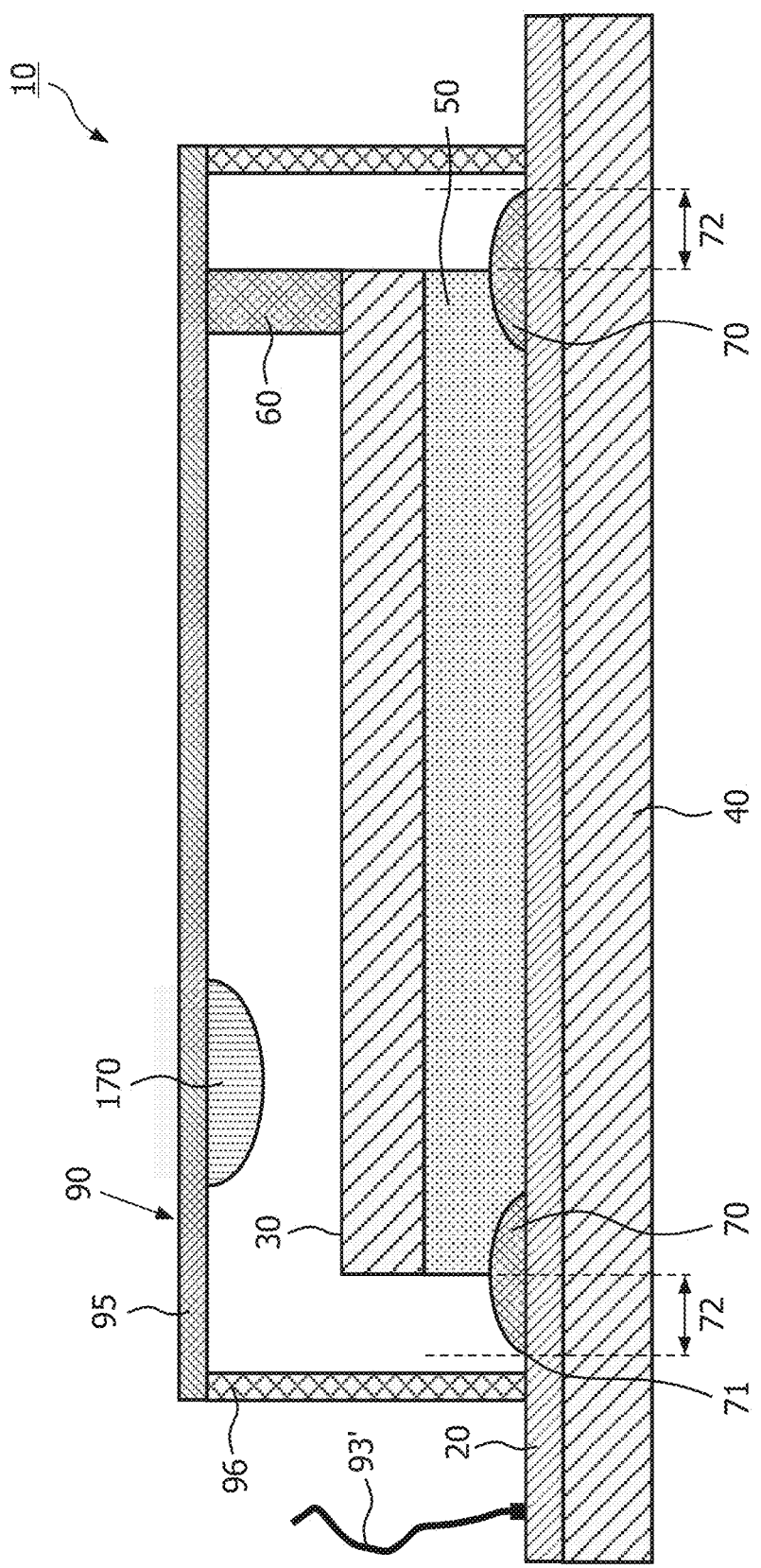
FIG. 17 the electroluminescent device with protective means arranged as a closed contour framing the electroluminescent layer stack as a side view.
Figure 18:
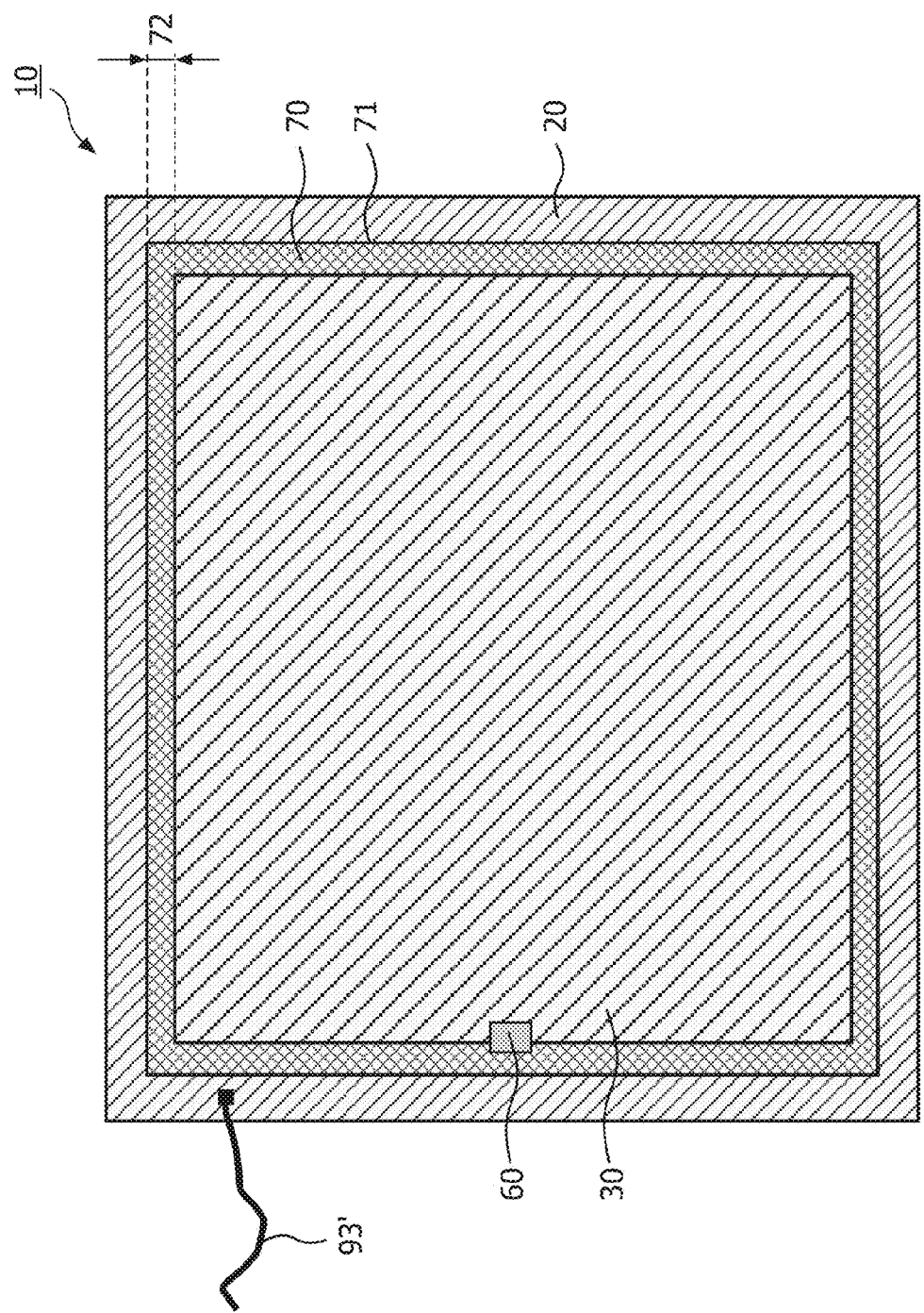
FIG. 18 the electroluminescent device with protective means arranged as a closed contour framing the electroluminescent layer stack as a top view of FIG. 17.

FIGS. 17 and 18 show the electroluminescent device with a protection means 70 arranged as a closed contour with an outer edge 71 on top of the substrate electrode 20. FIG. 18 is the top view of the electroluminescent device of FIG. 17 shown in a side view. The protection means 70 is at least partly covered by the counter electrode 30 establishing a contiguous gap 72 between the edge of the counter electrode 30 and the outer edge 71 of the closed contour of the protection means 70. Since there is no direct contact between counter electrode 30 and substrate electrode 20 and the closed contour of the protection means 70 is made of electrically non-conducting material, both electrodes 20, 30 are isolated against each other. The organic electroluminescent layer 50 fully covers the substrate electrode 30 inside the closed contour and extend partly on top of the protection means 70, preferably forming the same gap between the edge of the organic electroluminescent layer 50 and the outer edge 71 of the closed contour of the protection means 70. The contact means 60 is applied at an area of the counter electrode 30, where a protection layer is located fully below the contact means 60. In FIG. 22, only the non-covered area of the closed contour is visible. The closed contour 70 further extends below counter electrode 30 and contact means 60 as shown in FIG. 21. The closed contour enables the application of the same mask for depositing the electroluminescent layer stack and the counter electrode.

The described embodiments comprise as an example an electroluminescent layer 50 within the layer stack. In alternative embodiments within the scope of this invention, the layer stack may comprise layer additional to layer 50 such as hole transport layers, hole blocking layers, electron transport layers, electron blocking layers, charge injection layers further conducting layers etc.

| LIST OF NUMERALS: | |
|---|---|
| 10 | electroluminescent device |
| 20 | substrate electrode |
| 30 | counter electrode |
| 31 | counter electrode segments |
| 40 | substrate |
| 50 | organic electroluminescent layer |
| 60 | contact means |
| 70 | protective means |
| 71 | outer edge of the protective means as a closed contour |
| 72 | contiguous gap between edge of counter electrode and outer edge of the closed contour |
| 90 | encapsulation means |
| 92 | a gas tight feed through |
| 93, 93' | connection means |
| 94 | insulating rim |
| 95 | top of encapsulation means |
| 96 | side of encapsulation means |
| 97 | insulating means for gas tight feed through 92 |
| 100 | contact area |
| 101 | insulating border for contact area 100 |
| 170 | getter |
| 180 | scattering means |

The invention claimed is:
1. An electroluminescent device comprising:
a substrate;
a substrate electrode;
a counter electrode;

an electroluminescent layer stack with at least one organic electroluminescent layer arranged between the substrate electrode and the counter electrode;

an encapsulation means encapsulating at least the electroluminescent layer stack;

at least one contact means for electrically contacting the counter electrode to an electrical source; and at least one electrically non-conductive protective means arranged on the substrate electrode, wherein the at least one electrically non-conductive protective means covers and is directly disposed on at least an area, of a to surface of the substrate electrode, that is under a center of the contact means, and wherein all portions of the substrate electrode that are disposed under the area have a consistent conductivity for positive and negative charge carriers.

2. Electroluminescent device according claim 1, wherein the protective means is selected from the group consisting of: non-conductive glue, a photo resist, a lacquer, paint or a layer of glass, made of re-melted glass frit or an oxidized metal layer, comprising anodized Aluminum.

3. Electroluminescent device according to claim 2, wherein the non-conductive glue of the protective means is anhydrous and/or water free.

4. Electroluminescent device according to claim 1, wherein the encapsulation means is electrically connected to the contact means.

5. Electroluminescent device according to claim 1, wherein the encapsulation means comprises an electrically conductive gas tight feed through such that the gas tight feed through is electrically insulated against the encapsulation means.

6. Electroluminescent device according to claim 1, wherein the encapsulation means comprises an electrically conductive contact area electrically insulated against the encapsulation means.

7. Electroluminescent device according to claim 1, wherein the protective means comprises at least one scattering means, for scattering light, generated by the organic electroluminescent layer the scattering means being embedded in the protective means.

8. Electroluminescent device according to claim 1, wherein the protective means is arranged as a closed contour having an inner edge and an outer edge framing the electroluminescent layer stack, wherein the counter electrode partly covers the closed contour establishing a contiguous gap between the outer edge of the contour and the edge of the counter electrode sufficiently large to isolate the counter electrode from the substrate electrode.

9. Electroluminescent device according to claim 1, wherein a plurality of protective means are arranged on the substrate electrode.

10. Electroluminescent device according to claim 1, wherein the counter electrode is structured in a plurality of electrically separated counter electrode segments, wherein each counter electrode segment comprises at least one protective means.

11. Method for protecting a substrate electrode of an electroluminescent device, wherein the electroluminescent device comprises an electroluminescent layer stack with at least one organic electroluminescent layer arranged between a substrate electrode and a counter electrode on top of a substrate and an encapsulation means encapsulating at least the electroluminescent layer stack, the electroluminescent device comprising at least one contact means, for electrically contacting the counter to an electrical source, the method comprising:

applying at least one protective means on the substrate electrode, wherein the protective means is electrically non-conductive and is directly disposed on at least an area, of a top surface of the substrate electrode, that is under a center of the contact means and herein all portions of the substrate electrode that are disposed under the area have a consistent conductivity for positive and negative charge carriers.

* * * * *